(12) United States Patent
Yamazaki et al.

(10) Patent No.: US 7,592,193 B2
(45) Date of Patent: Sep. 22, 2009

(54) LIGHT EMITTING DEVICE

(75) Inventors: Shunpei Yamazaki, Setagaya (JP);
Toshimitsu Konuma, Atsugi (JP);
Hiroko Yamazaki, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 34 days.

(21) Appl. No.: 11/249,435

(22) Filed: Oct. 14, 2005

(65) Prior Publication Data

US 2006/0046334 A1 Mar. 2, 2006

Related U.S. Application Data

(62) Division of application No. 10/282,247, filed on Oct. 29, 2002, now Pat. No. 6,956,240.

(30) Foreign Application Priority Data

Oct. 30, 2001 (JP) ............................... 2001-332741

(51) Int. Cl.
*H01L 21/00* (2006.01)
(52) U.S. Cl. ............................ 438/29; 438/22; 313/498; 257/E51.018; 257/E51.026
(58) Field of Classification Search ............... 438/22, 438/28, 29, 34, 35; 257/79, 86, 88, 89, 13, 257/E51.018, E51.026; 313/504, 506, 503, 313/438, 498
See application file for complete search history.

(56) References Cited

U.S. PATENT DOCUMENTS

| 5,343,050 A | 8/1994 | Egusa et al. |
| 5,853,905 A | 12/1998 | So et al. |
| 5,886,365 A | 3/1999 | Kouchi et al. |
| 5,925,980 A * | 7/1999 | So et al. .................... 313/504 |
| 5,994,836 A | 11/1999 | Boer et al. |

(Continued)

FOREIGN PATENT DOCUMENTS

EP  1 065 723  1/2001

(Continued)

OTHER PUBLICATIONS

Chemical Handbook, Fundamental vol. II, Revised Fourth Edition, Maruzen Co., Ltd., Sep. 30, 1993, p. 489.

(Continued)

*Primary Examiner*—W. David Coleman
*Assistant Examiner*—Sun M Kim
(74) *Attorney, Agent, or Firm*—Eric J. Robinson; Robinson Intellectual Property Law Office, P.C.

(57) ABSTRACT

In an active matrix type light emitting device, a top surface exit type light emitting device in which an anode formed at an upper portion of an organic compound layer becomes a light exit electrode is provided. In a light emitting element made of a cathode, an organic compound layer and an anode, a protection film is formed in an interface between the anode that is a light exit electrode and the organic compound layer. The protection film formed on the organic compound layer has transmittance in the range of 70 to 100%, and when the anode is deposited by use of the sputtering method, a sputtering damage to the organic compound layer can be inhibited from being inflicted.

28 Claims, 19 Drawing Sheets

U.S. PATENT DOCUMENTS

| | | | |
|---|---|---|---|
| 6,100,954 A * | 8/2000 | Kim et al. | 349/138 |
| 6,130,001 A * | 10/2000 | Shi et al. | 428/690 |
| 6,140,763 A * | 10/2000 | Hung et al. | 313/503 |
| 6,172,459 B1 * | 1/2001 | Hung et al. | 313/506 |
| 6,246,179 B1 * | 6/2001 | Yamada | 315/169.3 |
| 6,323,515 B1 | 11/2001 | Yamazaki et al. | |
| 6,366,017 B1 * | 4/2002 | Antoniadis et al. | 313/506 |
| 6,380,687 B1 | 4/2002 | Yamazaki | |
| 6,489,638 B2 | 12/2002 | Seo et al. | |
| 6,518,700 B1 | 2/2003 | Friend et al. | |
| 6,538,374 B2 | 3/2003 | Hosokawa | |
| 6,552,496 B2 | 4/2003 | Yamazaki | |
| 6,642,544 B1 | 11/2003 | Hamada et al. | |
| 6,674,136 B1 | 1/2004 | Ohtani | |
| 6,677,613 B1 | 1/2004 | Yamazaki et al. | |
| 6,689,492 B1 * | 2/2004 | Yamazaki et al. | 428/690 |
| 6,774,573 B2 | 8/2004 | Yamazaki | |
| 6,830,494 B1 * | 12/2004 | Yamazaki et al. | 445/24 |
| 6,841,932 B2 * | 1/2005 | Aziz et al. | 313/503 |
| 6,933,672 B2 | 8/2005 | Hosokawa | |
| 6,956,240 B2 | 10/2005 | Yamazaki et al. | |
| 7,001,676 B2 | 2/2006 | Igarashi et al. | |
| 2001/0002703 A1 | 6/2001 | Koyama | |
| 2001/0004190 A1 | 6/2001 | Nishi et al. | |
| 2001/0025959 A1 | 10/2001 | Yamazaki et al. | |
| 2001/0035863 A1 | 11/2001 | Kimura | |
| 2001/0041270 A1 | 11/2001 | Maruyama et al. | |
| 2001/0043046 A1 | 11/2001 | Fukunaga | |
| 2001/0053559 A1 | 12/2001 | Nagao et al. | |
| 2001/0055828 A1 | 12/2001 | Kaneko et al. | |
| 2002/0011783 A1 | 1/2002 | Hosokawa | |
| 2002/0030443 A1 * | 3/2002 | Konuma et al. | 313/504 |
| 2002/0033664 A1 | 3/2002 | Kobayashi | |
| 2002/0093290 A1 | 7/2002 | Yamazaki | |
| 2002/0134979 A1 | 9/2002 | Yamazaki et al. | |
| 2003/0080338 A1 | 5/2003 | Yamazaki et al. | |
| 2003/0116772 A1 | 6/2003 | Yamazaki et al. | |
| 2003/0151355 A1 * | 8/2003 | Hosokawa | 313/504 |
| 2003/0171060 A1 | 9/2003 | Hirano et al. | |
| 2003/0214246 A1 | 11/2003 | Yamazaki | |
| 2005/0006667 A1 | 1/2005 | Yamazaki | |
| 2005/0035708 A1 | 2/2005 | Yamazaki et al. | |
| 2005/0248266 A1 | 11/2005 | Hosokawa | |

FOREIGN PATENT DOCUMENTS

| | | |
|---|---|---|
| EP | 1 093 167 | 4/2001 |
| EP | 1 191 820 | 3/2002 |
| JP | 03-114197 | 5/1991 |
| JP | 03-190088 | 8/1991 |
| JP | 03190088 A * | 8/1991 |
| JP | 03-274695 | 12/1991 |
| JP | 04-357694 | 12/1992 |
| JP | 06-290873 | 10/1994 |
| JP | 08-185984 | 7/1996 |
| JP | 08-330073 | 12/1996 |
| JP | 10-308284 | 11/1998 |
| JP | 2001-043980 | 2/2001 |
| JP | 2001-076868 | 3/2001 |
| JP | 2001-076882 | 3/2001 |
| JP | 2001-185354 | 7/2001 |
| JP | 2001-230086 | 8/2001 |
| JP | 2002-158090 | 5/2002 |

OTHER PUBLICATIONS

Adachi et al., *Data Book on Work Function of Organic Thin Films*, CMC Publishing Co., Ltd., Apr. 7, 2004, pp. 5-6 and 77.

Appeal Decision (Appeal 2008-17486) dated Feb. 10, 2009.

* cited by examiner

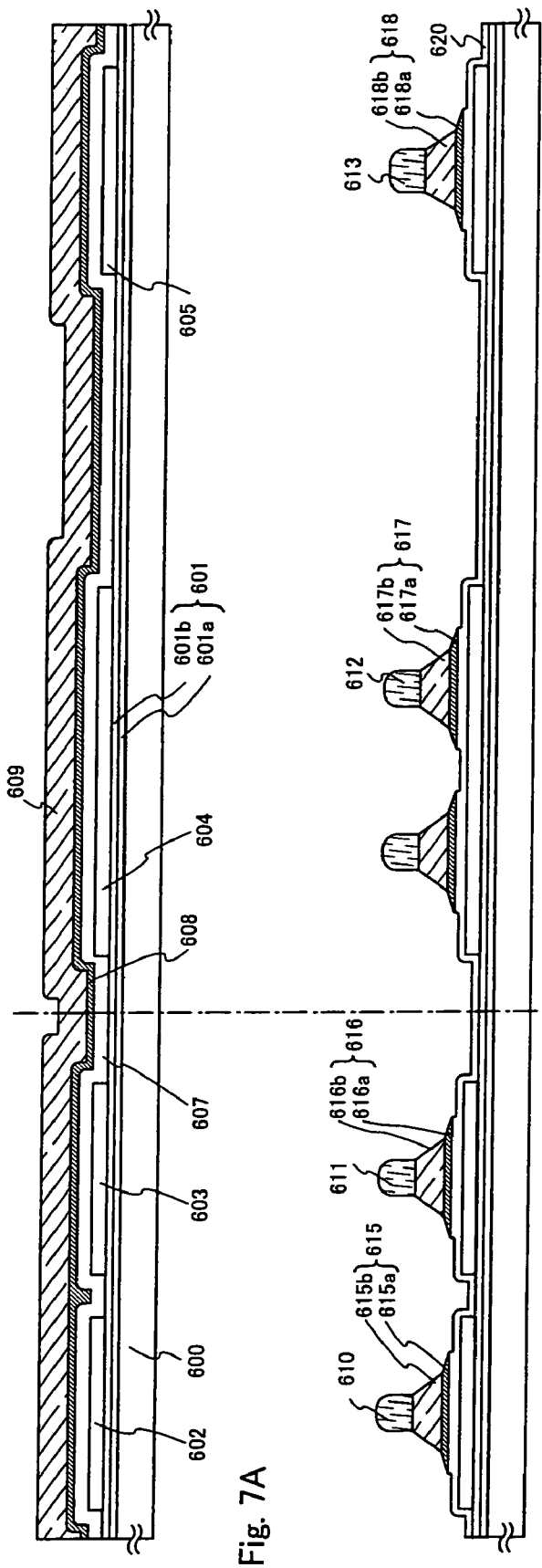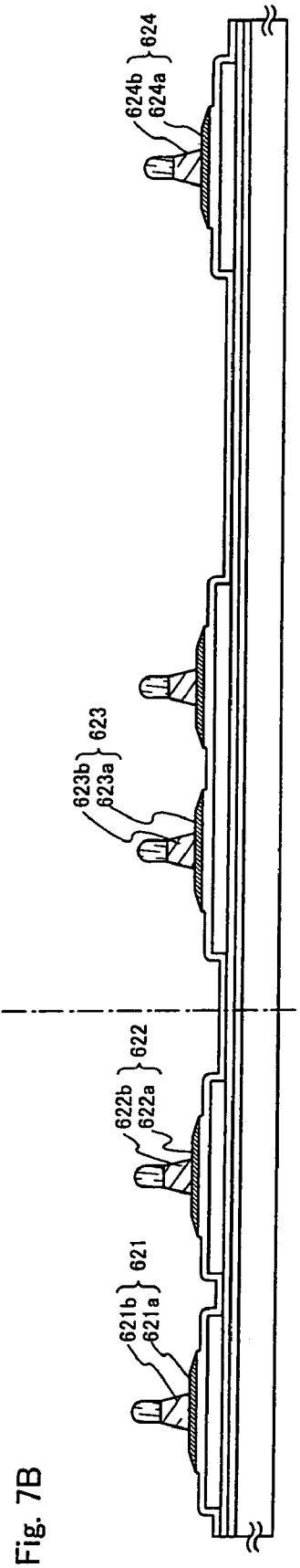
Fig. 7A
Fig. 7B
Fig. 7C

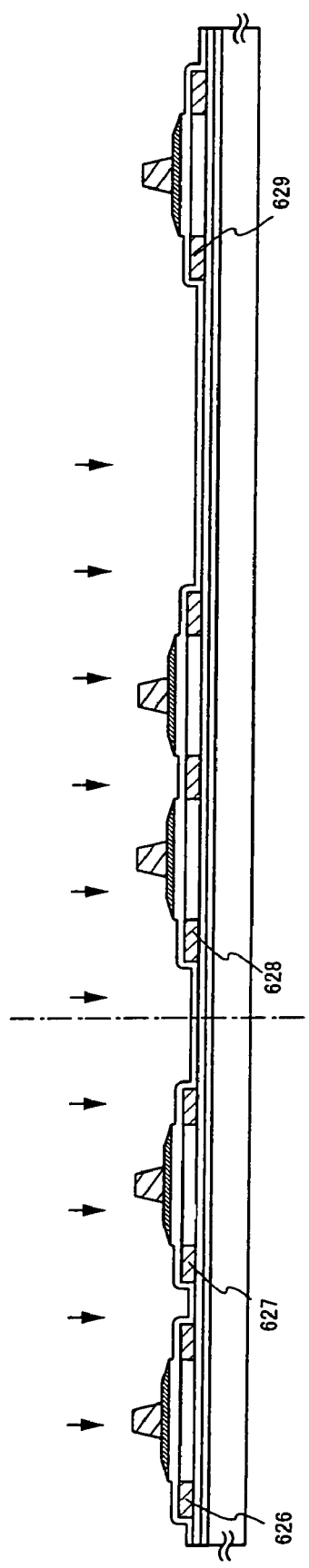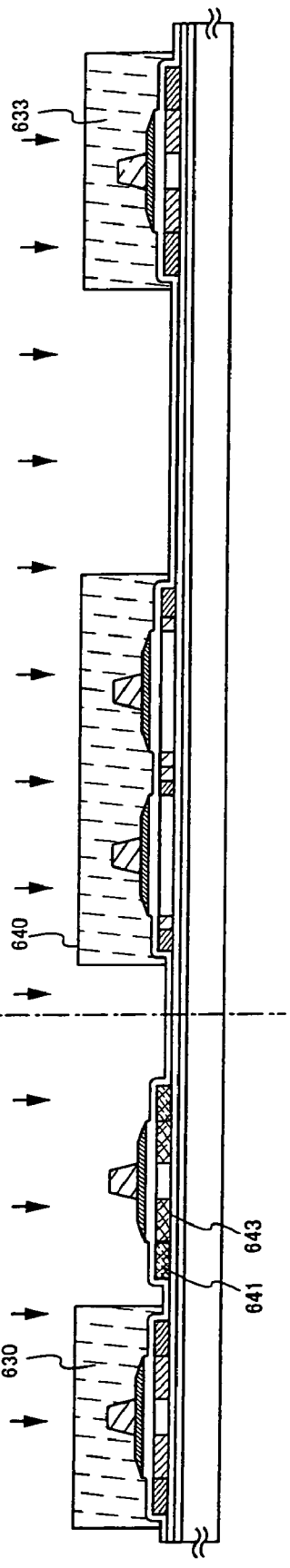
Fig. 8A
Fig. 8B
Fig. 8C

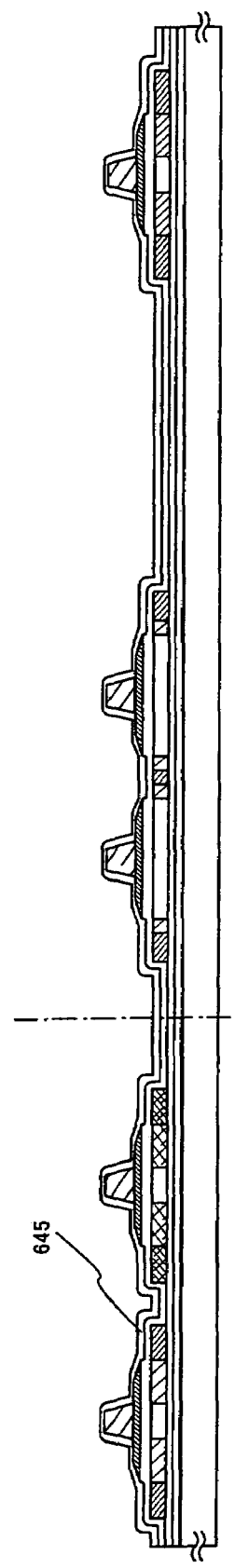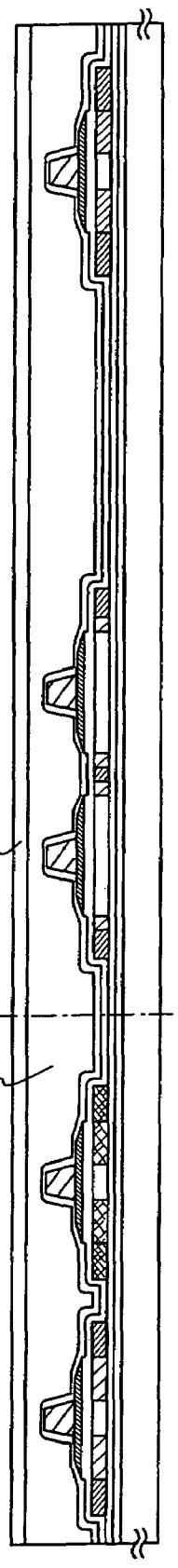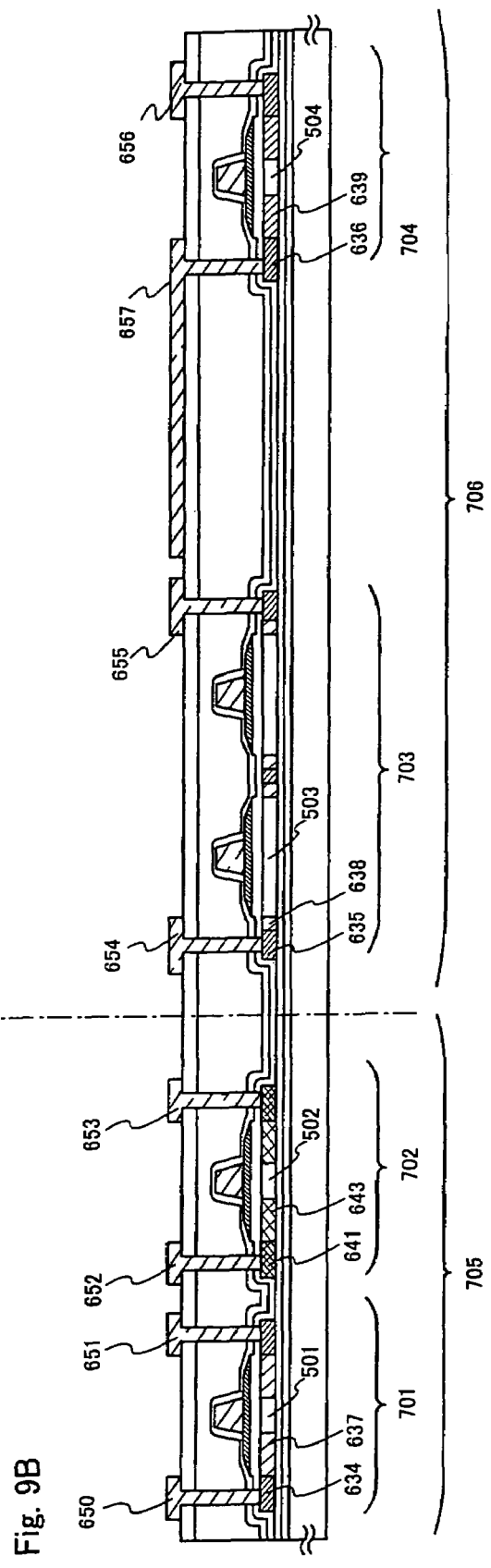
Fig. 9A
Fig. 9B
Fig. 9C

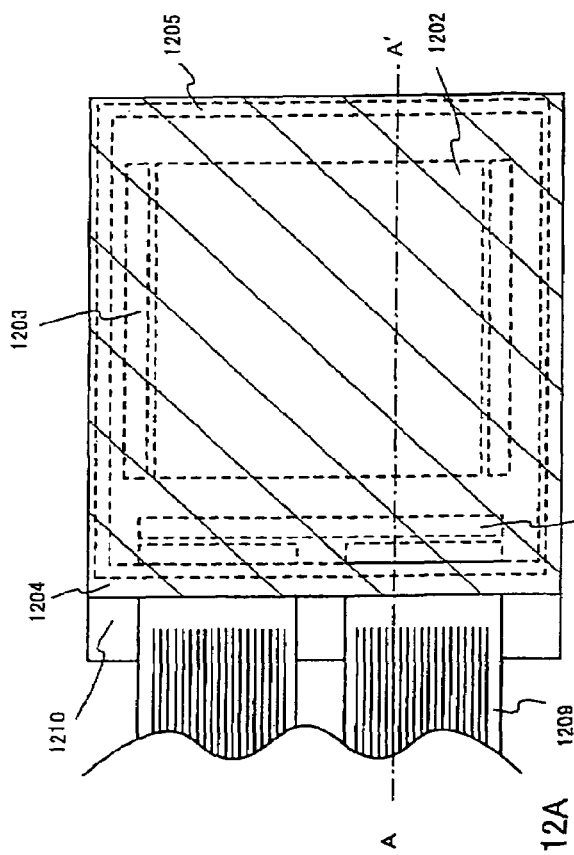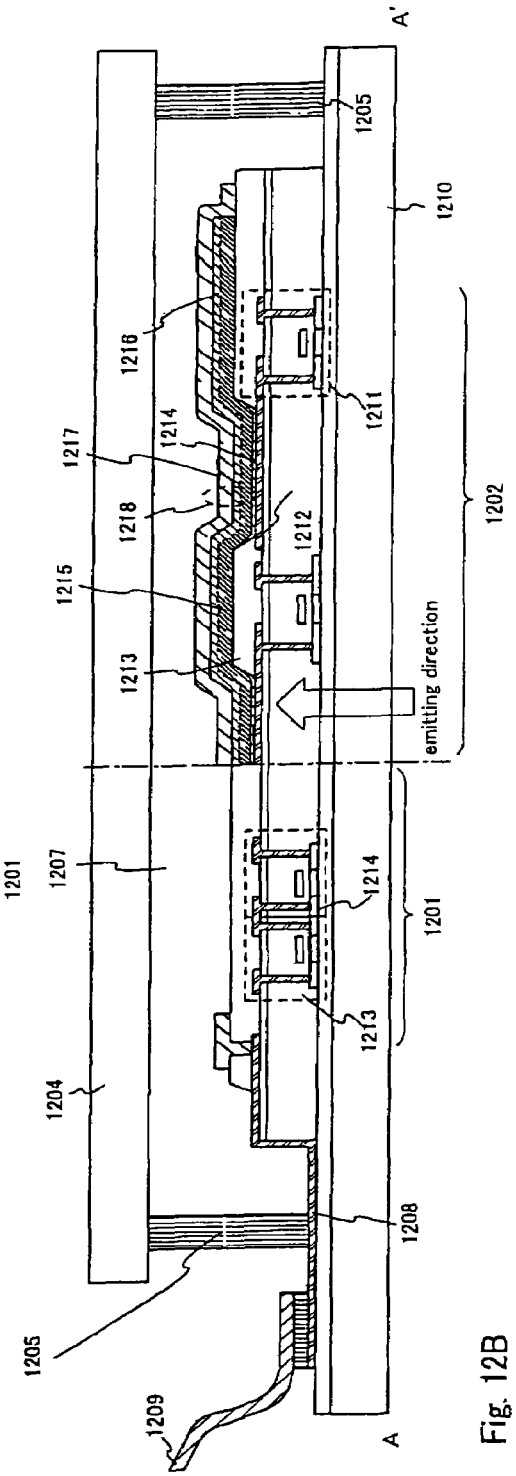
Fig. 12A
Fig. 12B

LIGHT EMITTING DEVICE

FIELD OF THE INVENTION

The present invention relates to a light emitting device using a light emitting element which has a film containing an organic compound (hereinafter referred to as an "organic compound layer") between a pair of electrodes and which can give fluorescence or luminescence by receiving an electric field. The light emitting device referred to in the present specification is an image display device, a light emitting device or a light source. Additionally, the following are included in examples of the light emitting device: a module wherein a connector, for example, a FPC (Flexible Printed Circuit) or a TAB (Tape Automated Bonding) tape, or a TCP (Tape Carrier Package) is set up onto a light emitting element; a module wherein a printed wiring board is set to the tip of a TAB tape or a TCP; and a module wherein IC (integrated circuits) are directly mounted on a light emitting element in a COG (Chip On Glass) manner.

DESCRIPTION OF THE RELATED ARTS

A light emitting element of the present invention is an element which emits light by receiving an electric field. It is said that the luminescence mechanism thereof is based on the following: by applying a voltage to an organic compound layer sandwiched between electrodes, electrons injected from the cathode and holes injected from the anode are recombined in the organic compound layer to form molecules in an exciting state (hereinafter referred to as "molecular exciton"); and energy is radiated when the molecular exciton moves back toward the ground state thereof.

The kind of the molecular exciton which are made from the organic compound may be a singlet exciton state or a triplet exciton state. In the present specification, luminescence (that is, light emission) may be based on the contribution of any one of the two.

In such a light emitting element, its organic compound layer is usually made of a thin film having a thickness below 1 μm. The light emitting element is a spontaneous light type element, wherein the organic compound layer itself emits light. Therefore, backlight, which is used in conventional liquid crystal displays, is unnecessary. As a result, the light emitting element has a great advantage that it can be produced into a thin and light form.

The time from the injection of carriers to the recombination thereof in the organic compound layer having a thickness of about 100 to 200 nm is about several tens nanoseconds in light of carrier mobility in the organic compound layer. A time up to luminescence, which includes the step from the recombination of the carrier to luminescence, is a time in order of microseconds or less. Therefore, the light emitting element also has an advantage that the response thereof is very rapid.

The light emitting element draw attention as next generation flat panel display element due to the characteristics of thin and light weight, high responsibility, and direct low voltage driving. Visibility of the light emitting element is comparatively good because the light emitting element is a self-emission type and wide viewing angle. Thus, the light emitting element is considered as an effective element for using a display screen of a portable apparatus.

In light emitting devices formed by arranging such light emitting elements in a matrix form, driving methods called passive matrix driving (simple matrix type) and active matrix driving (active matrix type) can be used. However, in the case in which the density of pixels increases, it is considered that the active matrix type wherein a switch is fitted to each pixel (or each dot) is more profitable since lower voltage driving can be attained.

Moreover, as an active-matrix type light emitting device shown in FIG. 18, it has the light emitting element 1707 in which TFT 1705 on a substrate 1701 and the anode 1702 are electrically connected, an organic compound layer 1703 is formed on an anode 1702, and a cathode 1704 is formed on the organic compound layer 1703. In addition, as anode materials in the light emitting element 1707, in order to make hole injection smooth, conductive materials of a large work function is used, and conductive materials that are transparent to the light, such as ITO (indium tin oxide) and IZO (indium zinc oxide), are used as a material which fulfills the practical characteristic. The light generated at the organic light emitting layer 1703 of the light emitting element 1707 radiates toward the TFT 1705 through the anode 1702 is a favored structure (hereinafter referred to as a bottom emission) of the light emission.

However, in the bottom emission structure, even if resolution is tried to be raised, TFT and wiring may be interfered due to their arrangement. Thus, a problem of a restriction of an aperture ratio is occurred.

In recent years, the structure that the light radiates upward from the cathode side (hereinafter referred to as a top emission) is devised. Concerning to the top emission light emitting device is disclosed in unexamined patent publication No. 2001-43980. In the case of the top emission type, the aperture ratio can be enlarged than that in the case of the bottom emission type, so that the light emitting element which can obtain higher resolution can be formed.

However, in the case of above-described invention, since there is no material which is transparent to the light, a transparent conductive film, ITO is laminated after the cathode is formed to radiate the light from the cathode side.

SUMMARY OF THE INVENTION

In the case of an element structure in which the light is taken out from the above-described cathode side, a sufficient film formation is required in order to maintain the function as a cathode, whereas in order to secure the translucency as an electrode for taking out the light, it is required to form in an extremely thin film, the contradiction occurs if both of the conditions are to be satisfied.

Hence, in the present invention, in order to solve these problems, in the preparation of the upper surface injection type light emitting device, as for an electrode for taking out the light, a transparent, electrically conductive film having a property already achieved a practicable level of ITO (indium tin oxide), IZO (indium zinc oxide) or the like is used as an electrode material. An object of the present invention is to prepare a light emitting element whose element structure is different from the conventional upper surface injection type light emitting device.

Moreover, in the case where a transparent electrode is formed as an electrode for taking out the light, after an organic compound layer has been formed, the transparent, electrically conductive film is formed. Usually, since the film formation of the transparent, electrically conductive film is performed by a sputtering method, there may be such a problem that the element deterioration is caused due to the fact that the surface of the organic compound is damaged by the sputtering during the film formation.

Hence, in the present invention, in the preparation of an upper surface injection type light emitting element, an object of the present invention is to enhance the light emitting efficiency of a light emitting element more than that as before without giving any damage to the organic compound layer.

The present invention is characterized in that a protection film is formed on the interface between an anode of a light emitting element consisting of a cathode, an organic compound layer and an anode, and the organic compound layer in order to solve the problem.

It should be noted that in the present invention, an anode is formed with an electrically conductive film having the translucency and a function as an electrode for taking out the light. Moreover, since a cathode is formed on a pixel electrode, it is not always necessary that the cathode material should have a radiation shield effect. However, it is required that the laminated film has a radiation shield effect when the pixel electrode and the cathode electrode have been laminated and formed. It is because the light occurred in the organic compound layer is efficiently taken out from the anode side. It should be noted that the radiation shield effect is referred to the fact that a transmittance of visible light with respect to the laminated film is 10% or less. Moreover, it is characterized in that a material whose work function is 3.8 eV or less is used as a cathode material. It should be noted that since an energy barrier between the cathode and the organic compound layer can be relieved by using such a cathode material, an injection efficiency of electrons from the cathode is enhanced.

Moreover, after an organic compound layer has been formed on a cathode, a protection film is formed on the organic compound layer. A protection film referred in the present specification has a function for preventing the organic compound layer from receiving a sputtering damage during the anode film formation after the organic compound layer formation. Furthermore, as for a material for forming a protection film, it is characterized in that a material whose work function is in the range from 4.5 to 5.5 eV so as to be capable of enhancing the injection efficiency of hole from the anode. In the present invention, a mixture region is formed at an interface between the organic compound film and the protection film. In this specification, the mixture region is that it is formed at an interface between the organic compound film and the protection film, and formed by materials for forming an organic compound layer and a protection layer.

By forming the mixture region in the interface, the energy barrier can be eased generated from the work function of materials for forming the organic compound layer and the work function of materials for forming the protection film. Thus, the transportation of the holes injected from an anode and the adhesion of the protection film formed on the organic compound layer can be improved, and the element characteristics can also be improved.

Moreover, although an anode of a light emitting element is formed after the protection film has been formed, in the present invention, since a transparent, electrically conductive film of ITO, IZO or the like which is a conventional anode material can be employed, an anode can be prepared as in the same way as the conventional anodes prepared so far without giving any change.

A configuration disclosed in the present invention is characterized in that the light emitting device comprises: a thin film transistor formed over an insulating surface; an interlayer insulating film formed over the thin film transistor; a pixel electrode formed on the interlayer insulating film; an insulating film covering at least one edge portion of the pixel electrode; a cathode formed on at least the pixel electrode; an organic compound layer formed on at least the cathode; a protective film formed on at least the organic compound layer; and an anode formed on at least the protective film, the thin film transistor comprises a source region and a drain region, and the pixel electrode is electrically connected to either one of the source region or the drain region in an opening formed in the interlayer insulating film, a mixture region is formed between the organic compound layer and the protection film, and the mixture region comprises an organic compound that constitutes the organic compound layer and a metal that constitutes the protection film.

Another configuration of the present invention is characterized in that a light emitting device comprises: a thin film transistor formed over an insulating surface; an interlayer insulating film formed over the thin film transistor; a pixel electrode formed on the interlayer insulating film; an insulating film covering at least one edge portion of the pixel electrode; a cathode formed on at least the pixel electrode; an organic compound layer formed on at least the cathode; a protective film formed on at least the organic compound layer; and an anode formed on at least the protective film, the thin film transistor comprises a source region and a drain region, and the pixel electrode is electrically connected to either one of the source region or the drain region in an opening formed in the interlayer insulating film, a mixture region is formed between the organic compound layer and the protection film, and the mixture region comprises an organic compound that constitutes the organic compound layer and a metal that constitutes the protection film, and has an average film thickness in the range of 0.5 to 10 nm.

Another configuration of the present invention is characterized in that a light emitting device comprises: a thin film transistor formed over an insulating surface; an interlayer insulating film formed over the thin film transistor; a barrier film formed over the interlayer insulating film; a pixel electrode formed over the barrier film; an insulating film covering at least one edge portion of the pixel electrode; a cathode formed on at least the pixel electrode; an organic compound layer formed on at least the cathode; a protective film formed on at least the organic compound layer; and an anode formed on at least the protective film, the thin film transistor comprises a source region and a drain region, and the pixel electrode is electrically connected to either one of the source region or the drain region in an opening formed in the interlayer insulating film, a mixture region is formed between the organic compound layer and the protection film, and the mixture region comprises an organic compound that constitutes the organic compound layer and a metal that constitutes the protection film.

Another configuration of the present invention is characterized in that a light emitting device comprises: a thin film transistor formed over an insulating surface; an interlayer insulating film formed over the thin film transistor; a barrier film formed over the interlayer insulating film; a pixel electrode formed over the barrier film; an insulating film covering at least one edge portion of the pixel electrode; a cathode formed on at least the pixel electrode; an organic compound layer formed on at least the cathode; protective film formed on at least the organic compound layer; and an anode formed on at least the protective film, the thin film transistor comprises a source region and a drain region, and the pixel electrode is electrically connected to either one of the source region or the drain region in an opening formed in the interlayer insulating film, a mixture region is formed between the organic compound layer and the protection film, and the mixture region comprises an organic compound that constitutes the organic compound layer and a metal that constitutes the protection film, and has an average film thickness in the range of 0.5 to 10 nm.

It should be noted that in the above-described configuration, the barrier film consists of an insulating film containing aluminum or silicon such as aluminum nitride (AlN), aluminum nitrided oxide (AlNO), silicon nitride (SiN), silicon oxynitride (SiNO) or the like, can prevent alkali metal contained as a material for cathode from invading into the interlayer insulating film side as well as can prevent degas such as oxygen or the like from the interlayer insulating film, water or the like from invading into the light emitting element.

In addition, another configuration of the present invention is characterized in that a light emitting device comprises: a thin film transistor formed over an insulating surface; an interlayer insulating film formed over the thin film transistor; a pixel electrode formed on the interlayer insulating film; an insulating film covering at least one edge portion of the pixel electrode; a cathode formed on at least the pixel electrode; an organic compound layer formed on at least the cathode; a protective film formed on at least the organic compound layer; and an anode formed on at least the protective film, the thin film transistor comprises a source region and a drain region, and the pixel electrode is electrically connected to either one of the source region or the drain region in an opening formed in the interlayer insulating film, a mixture region is formed between the organic compound layer and the protection film, and the organic compound layer comprises a first layer containing a first organic material and a second layer containing a second organic material, and a mixture layer including the first and second materials is provided between the first and second layers.

In the above-described respective configuration, as an interlayer insulating film and an insulating film, except for an insulating film containing silicon such as silicon oxide, silicon nitride, silicon oxynitride or the like, polyimide, polyamide, acryl (including photosensitive acryl), an organic resin film such as BCB (benzocyclobutene) or the like can be used. Moreover, a coated silicon oxide film (SOG: Spin On Glass) formed by a coating method can be used.

Moreover, in the above-described respective configurations, an pixel electrode has a function as a wire electrically connected to a TFT formed on the substrate, and is formed by utilizing a single or laminated metal material having a low resistance such as aluminum, titanium, tungsten and the like.

In the above-described respective configurations, a cathode consists of a material whose work function is small, and is formed on the pixel electrode. Here, although an element belonging to 1 group or 2 group of the periodic law for elements, specifically, except for alkali metal and alkali-earth metal, transition metal containing rare earth metal and the like are to be applied, in the present invention, an alloy and compound containing these are particularly suitable for it. It is because a metal whose work function is small is unstable in the air and the oxidization and peeling off are to be the problems.

Concretely, as a fluoride containing the above-described metal, cesium fluoride (CsF), calcium fluoride (CaF), barium fluoride (BaF), lithium fluoride (LiF) and the like can be used. Except for these, an alloy in which silver is added to magnesium (Mg: Ag), an alloy in which lithium is added to aluminum (Al: Li), an alloy in which aluminum contains lithium, calcium, magnesium and the like can be used. It should be noted that in the case of an aluminum alloy to which lithium is added, the work function of aluminum could be minimized.

It should be noted that although an cathode is formed in a thickness of 1 to 50 nm by utilizing the above-described material, but in the case of the above-described fluorides, it is preferable that the cathode is used as an extremely thin film having a thickness of 5 nm or less. Moreover, except for these, a material such as lithium acetylacetonate (Liacac) or the like can be used.

Moreover, in the above-described respective configurations, an organic compound layer is a field where carriers injected from a cathode and an anode are recombined. Although there are some cases where an organic compound layer is formed with a single layer of the light emitting layer only, the present invention also includes the cases where an organic compound layer is formed with multiple layers of a hole injection layer, a hole transportation layer, a light emitting layer, a blocking layer, an electron transportation layer, an electron injection layer and the like. Furthermore, in the case where the multiple layers are laminated and formed, in the respective laminated interfaces, a layer formed by mixing the materials forming the adjacent layers (in the present specification, it is referred to as a mixed layer) can be also formed. It should be noted that since an energy gap occurring on the laminated interface could be relaxed, the mobility of the carriers within the organic compound layer could be enhanced and the drive voltage could be lowered.

In each above configuration, preferably, the mixture region is comprised of materials forming the organic compound layer and metal materials forming the protective film, and a content of metal materials in a whole mixture region is set in the range of 10 to 50%.

Furthermore, an organic compound layer in the present invention is formed by utilizing a low molecular compound based organic compound or a high molecular compound based organic compound, and an inorganic material (concretely, except for oxides of Si and Ge, a material in which any oxide of carbon nitride (CxNy), alkali metal element, alkali earth metal element and lanthanoide based element and any of Zn, Sn, V, Ru, Sm and Ir are combined, or the like) is capable of being used for one portion of the organic compound layer.

Moreover, in the above-described respective configurations, a protection film is formed on the organic compound layer, and has a function for preventing from sputtering damage during the anode formation. It should be noted that since the protection film is formed being in contact with an anode, it is formed by utilizing a metal material having a work function as the same as the work function of ITO or the like to be an anode material or more (4.5-5.5 eV) as its material. It should be noted that in the present embodiment, metals belong to transition metals of the periodic table and it is preferable to use a metal material belonging to 9 group, 10 group or 11 group of the periodic table, particularly the long-period periodic table, of elements such as gold (Au), silver (Ag), platinum (Pt) and the like.

It should be noted that in the case of an element structure of the present invention, since a light generated in the organic compound layer which transmits through the protection film is injected into the external from the anode, the transmittance of the visible light is required to be in the range of 70 to 100%. Therefore, the transmittances of either of the anode and the protection film are required to be in the range of 70 to 100%. Moreover, as for a protection film in the present invention, an object is to prevent it from sputtering damage during the anode film formation, so the film should not necessarily be uniform. In order to secure the transmittance, it may be formed in a film thickness of 5 to 50 nm.

It should be noted that an emission of the light obtained from a light emitting device of the present invention might include any one of an emission of the light due to the singlet excited state or triplet excited state, or due to both of these.

BRIEF DESCRIPTION OF THE DRAWINGS

FIGS. 7A to 7C are diagrams for illustrating a manufacturing step of a light emitting device of the present invention;

FIGS. 8A to 8C are diagrams for illustrating manufacturing steps of a light emitting device of the present invention;

FIGS. 9A to 9C are diagrams for illustrating a manufacturing step of a light emitting device of the present invention;

FIGS. 12A and 12B are diagrams for illustrating an element structure of a light emitting device of the present invention;

DESCRIPTION OF THE PREFERRED EMBODIMENT

The preferred Embodiments of the present invention will be described below with reference to FIGS. 1A and 1B. It should be noted that in FIG. 1A, an element structure of a light emitting element 102 formed on a pixel electrode 101 is shown.

Figure 1A:
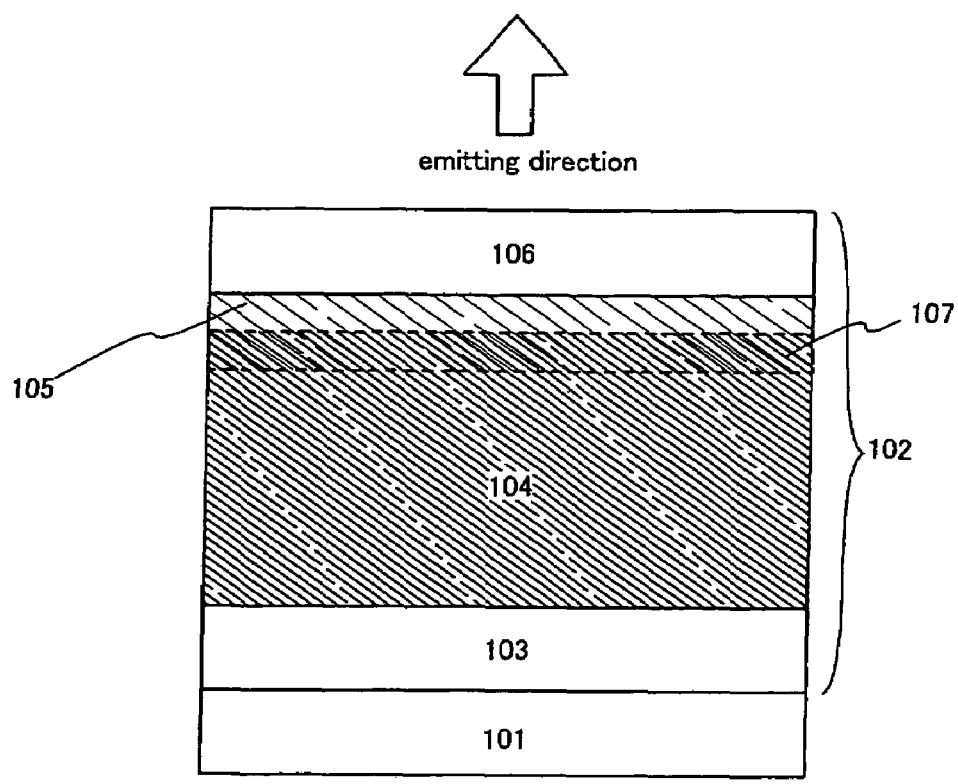
FIGS. 1A and 1B are diagrams for illustrating an element structure of a light emitting device of the present invention.

As shown in FIG. 1A, a cathode 103 is formed on the pixel electrode 101, a protection film 105 is formed being in contact with the organic compound layer 104, and on the protection film, an anode 106 is formed. It should be noted that electrons are injected into the organic compound layer 104 from the cathode 103, a hole is injected from the anode 106 into the organic compound layer 104. Then, in the organic compound layer 104, an emission of light is obtained by recombining a hole and an electron.

Moreover, the pixel electrode 101 has a function for electrically connecting the anode to either of the source region or the drain region of a thin transistor for driving a light emitting element (hereinafter, referred to as TFT). It should be noted that as shown in FIGS. 1A and 1B, in the case where a pixel electrode is provided separately from the anode, since it does neither directly come into contact with the organic compound layer 104, nor function it as an electrode of the light emitting element 102 (cathode), it may be formed with a material having a high electrical conductivity required for a wiring material. However, in the case where the pixel electrode itself is used as a cathode of a light emitting element, it is necessary to use a metal material whose work function is small as it functions as a cathode (concretely, work function is 3.8 eV or less).

Next, the cathode 103 is formed on the pixel electrode 101. It should be noted that as a material whose work function is small (concretely, the work function is 3.8 eV or less) used for the cathode 103, an element belonging to 1 group or 2 group of the periodic law of elements, specifically, a transition metal including a rare earth metal, an alkali metal, and an alkali earth metal is to be applied. However, in the present invention, particularly, an alloy or a compound containing them is to be applied. This is because a metal whose work function is small is unstable in the air, and the oxidization and the peeling off become problems.

Moreover, an organic compound layer 104 contains a light emitting layer, and is formed by utilizing or combining and laminating any one or a plurality of a hole injection layer, a hole transportation layer, a blocking layer, an electron transportation layer and an electron injection layer and the like which have different functions with respect to a carrier. It should be noted that as a material for forming the organic compound layer 104, the known material could be employed. It should be noted that in the present invention, in the case where the organic compound layer has the laminated structure consisting of two kinds or more layers, a layer consisting of materials forming adjacent layers on its laminated interface (hereinafter, referred to as mixed layer) could also be formed. It should be noted that since the energy gap can be relaxed by the work function in the interface, the transportation capability of carriers (hole and electron) in the internal of the organic compound layer could be enhanced.

In the present invention, after the organic compound layer 104 is formed, the mixture region 107 is formed on the organic compound layer 107. The mixture region 107 is comprising the organic compounds for forming the organic compound layer 104 and metal materials for forming the protection film 105.

Furthermore, a protection film 105 formed on the organic compound layer 104 has a function for preventing a sputtering damage during formation of an anode 106. In addition to that, the protection film is supposed to prevent water and oxygen from penetrating into the organic compound layer that is formed previously. Moreover, since the protection film 105 is formed being in contact with the anode 106, a metal material having a work function as the same as or more than that of ITO or the like (4.5 eV-5.5 eV) which is to be a material for the anode 106 for the purpose of preventing the hole from injection capability from the anode may be employed.

Figure 1B:
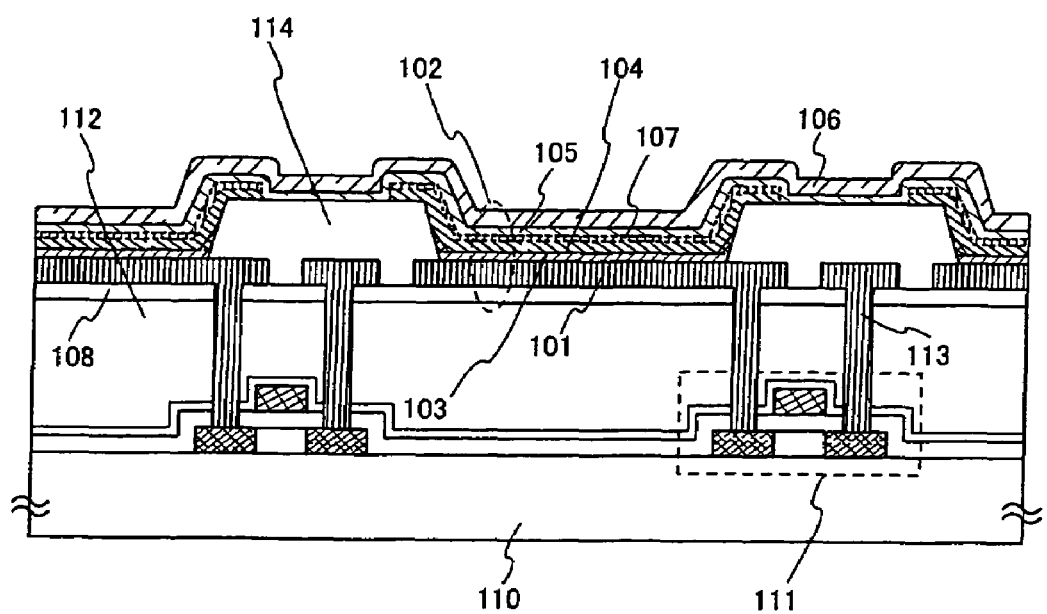

Moreover, in FIG. 1B, an active matrix type light emitting device, in which a TFT 111 formed on a substrate 110 (also referred to as current control TFT) and the light emitting element 102 shown in FIG. 1A are electrically connected with each other, is shown.

In FIG. 1B, the current control TFT 111 has a source region, a drain region, a channel region, a gate insulating film and a gate electrode, and an interlayer insulating film 112 is formed by covering them. Furthermore, in order to prevent the degas and water from the interlayer insulating film 112 from releasing, a barrier film 108 is formed, a pixel electrode 101 is formed on the barrier film 108 at the time when a wiring 113 has been formed on the interlayer insulating film 112.

It should be noted that in the present embodiment, the wiring 113 is the piece of equipment that inputs an electric signal into either one of the source region or the drain region of the TFT 105, and the pixel electrode 101 is a piece of equipment that outputs an electric signal from the other region.

It should be noted that the edge portions of the pixel electrode 101 is covered with the insulating layer 114, the cathode 103 is formed on the pixel electrode 101 exposed on the surface. Moreover, on the cathode 103, the organic compound layer 104, the protection film 106 and the anode 107 are laminated similar to those shown in FIG. 1A, and a light emitting element 102 is completed.

Here, a method of fabricating an active matrix type light emitting device will be described below with reference to FIG. 2A to FIG. 3C.

Figure 2A:
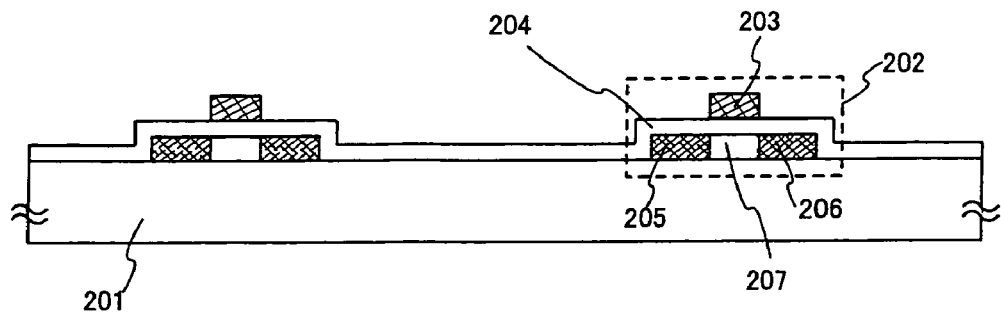
FIGS. 2A to 2D are diagrams for illustrating a manufacturing step of a light emitting device of the present invention.

In FIG. 2A, a TFT 202 is formed on a substrate 201. It should be noted that in the present embodiment, a glass substrate is used as the substrate 201 but a quartz substrate may also be used. Moreover, in the present invention, since the light is emitted from the light emitting element to the reverse side of the substrate, the substrate is not required to be particularly translucent, the known material having a light shielding property can be also used. The TFT 202 may be formed by utilizing the known method, the TFT 202 comprises at least a gate electrode 203, a gate insulating film 204, a source region 205, a drain region 206 and a channel formation region 207. It should be noted that the channel region 207 is formed between the source region 205 and the drain region 206.

Figure 2B:
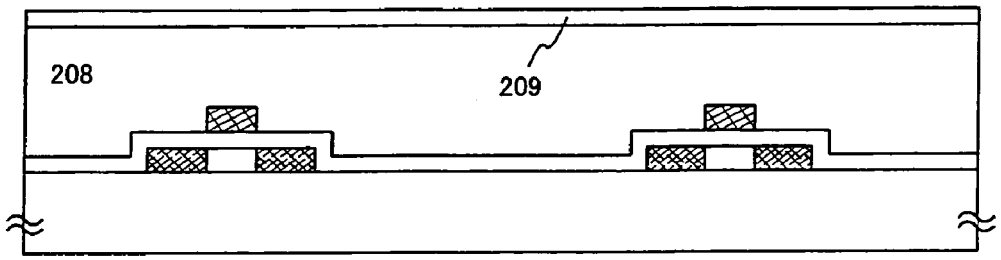

Moreover, as shown in FIG. 2B, an interlayer insulating film 208 covering the TFT 202 is provided in a film thickness of 1 to 2 μm, a barrier film 209 is formed on the interlayer insulating film 208.

It should be noted that as a material for forming the interlayer insulating film 208, an organic resin film such as polyimide, polyamide, acryl (including photosensitive or non-photosensitive acryl), BCB (benzocyclobutene) except for an insulating film containing silicon such as silicon oxide, silicon nitride and silicon oxynitride or the like can be used. Moreover, for example, a film in which the above-described materials are laminated as a laminated film made of acryl and silicon oxide can be also used. It should be noted that the interlayer insulating film is formed by a sputtering method or a vapor deposition method. Furthermore, as a silicon oxide film formed by a coating method, a coated silicon oxide film (SOG: Spin On Glass) can be also used.

Moreover, as a material for forming the barrier film 209, concretely, an insulating film containing aluminum or silicon such as aluminum nitride (AlN), aluminum oxynitride (AlNO), aluminum nitrided oxide (AlNO), silicon nitride (SiN), silicon oxynitride (SiNO) or the like can be used. Moreover, it is desirable that it is formed in a film thickness of 0.2 to 1.0 μm. It should be noted that by providing the barrier film 209, the diffusion of an alkali metal, water, an organic gas or the like can be prevented.

Figure 2C:
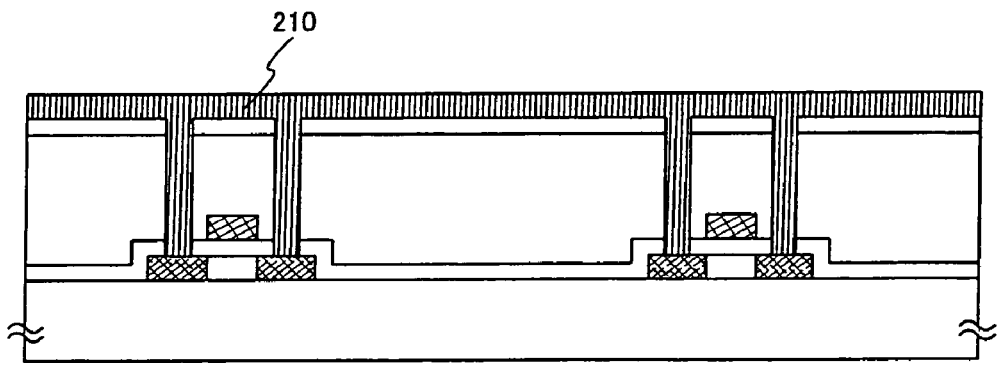

Then, after the openings have been formed in the interlayer insulating film 208 and the barrier film 209, an electrically conductive film 210 is formed on the barrier film 209 by a sputtering method (FIG. 2C).

As an electrically conductive material for forming the electrically conductive film 210, an element selected from tantalum (Ta), tungsten (W), titanium (Ti), molybdenum (Mo), aluminum (Al), copper (Cu), or an alloy material or compound material mainly composed of the elements can be used. Moreover, it may be made into a laminated structure by combining a plurality of these. It should be noted that here, a three-layer structure, in which a tungsten film in a film thickness of 50 nm, an alloy of aluminum and silicon (Al—Si) in a film thickness of 500 nm, and titanium nitride in a film thickness of 30 nm are in turn laminated, is used.

Figure 2D:
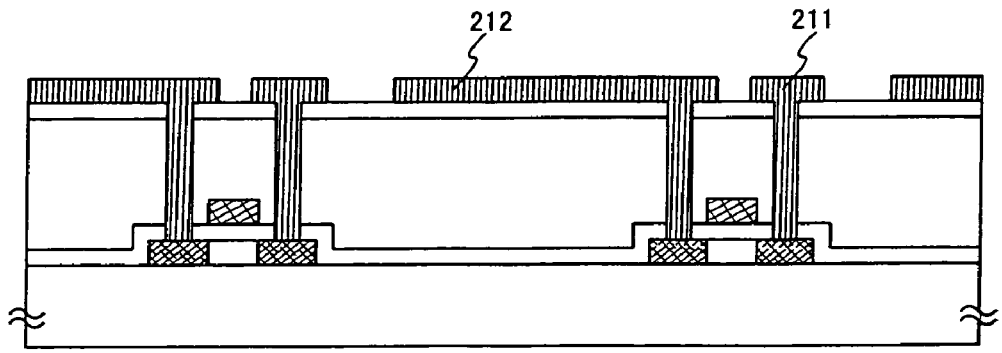

Subsequently, as shown in FIG. 2D, a wiring 211 electrically connected to the TFT 202 is formed by patterning the above-described electrically conductive film 210. It should be noted that in the present invention, a pixel electrode 212 also having a function as a wiring is also formed at the same time. Moreover, as a method of patterning, either of dry etching method or wet etching method may be used.

Figure 3A:
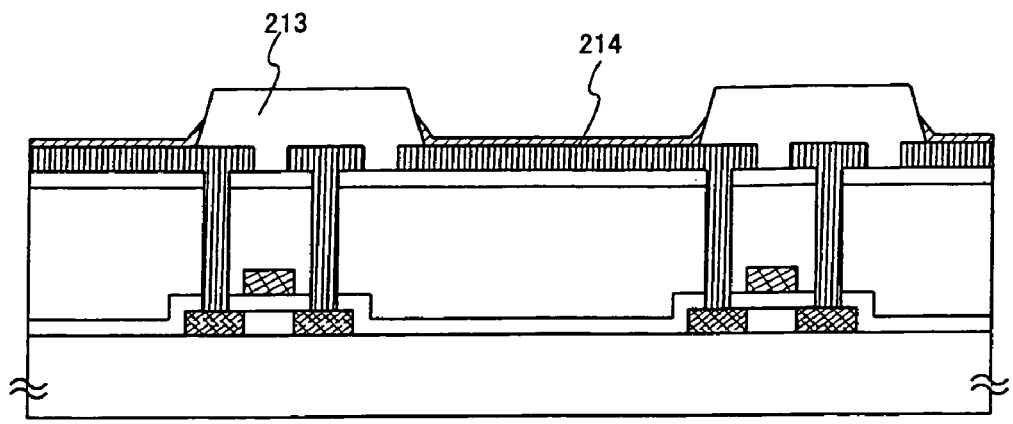
FIGS. 3A to 3C are diagrams for illustrating a manufacturing step of a light emitting device of the present invention.

Moreover, as shown in FIG. 3A, an insulation layer 213 is formed so as to cover the gap between the edge portion and the anode. It should be noted that after the insulating film has been formed, the insulation layer 213 could be obtained by forming the opening in the pixel electrode. As a material for forming the insulation layer 213, an organic resin film such as polyimide, polyamide, acryl (including photosensitive acryl), BCB (benzocyclobutene) or the like except for a material containing silicon such as silicon oxide, silicon nitride, silicon oxynitride or the like. Furthermore, as a silicon oxide film, a coated silicon oxide film (SOG: Spin On Glass) can also be used. It should be noted that it can be formed in a film thickness of 0.1 to 2 μm, but particularly in the case where materials containing silicon such as silicon oxide, silicon nitride and silicon oxynitride or the like are used, it is desirable to form in a film thickness of 0.1 to 0.3 μm.

Next, a cathode 214 is formed. It should be noted that the cathode 214 is prepared using a metal mask through patterning by a sputtering method or a vapor deposition method. It should be noted that as a material for forming the cathode 214, a material whose work function is small is preferable in order to enhance the injection capability of an electron from the cathode 214, an element belonging to 1 group or 2 group of the periodic law for elements, that is, a transition metal containing a rare earth metal, or the like, except for an alkali metal and an alkaline earth metal, is used.

Concretely, as a fluoride containing the above-described metals, cesium fluoride (CsF), calcium fluoride (CaF), barium fluoride (BaF), lithium fluoride (LiF) or the like can be used. Except for these, an alloy in which silver is added to magnesium (Mg: Ag), an alloy in which lithium is added to aluminum (Al: Li), an alloy containing aluminum, lithium, calcium and magnesium, or the like can be used. It should be noted that in the case of an aluminum alloy to which lithium is added, the work function of aluminum could be minimized.

It should be noted that although the cathode 214 is formed in a film thickness of 1 to 50 nm by utilizing the material described above, in the case where the above-described fluoride is used, preferably it is used as a extremely thin film in a film thickness of 5 nm or less. Moreover, except for that, a material such as lithium acetylacetonate (Liacac) or the like can be used.

Figure 3B:
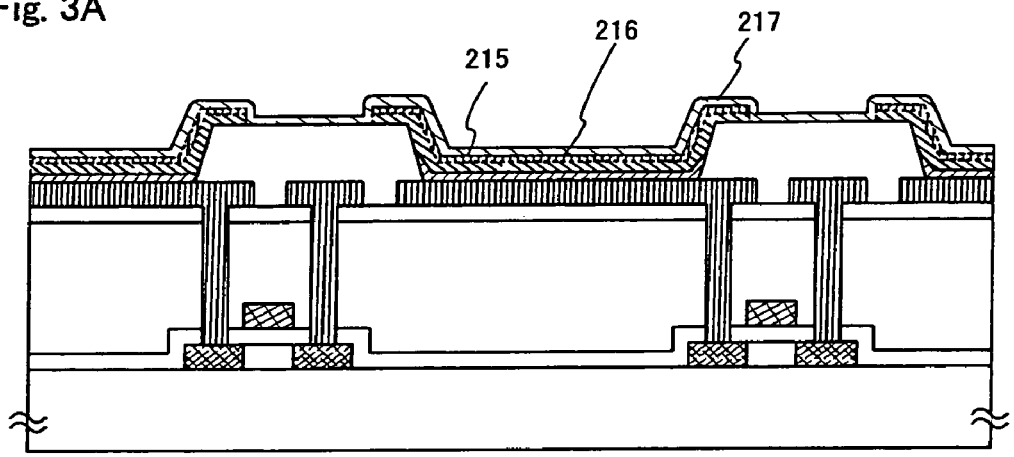
Figure 3C:
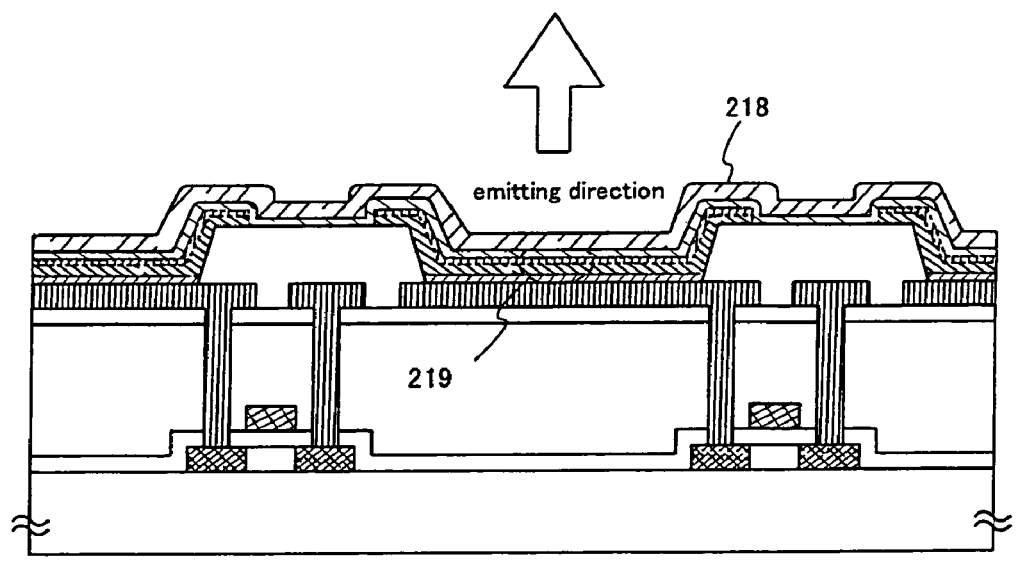

Next, an organic compound layer is formed on the cathode 214 (FIG. 3B). It should be noted that as a material for forming the organic compound layer 215, a low molecular compound based, high molecular compound based or medium molecular compound based organic compound, which are publicly known, could be used. It should be noted that the medium molecular compound based organic compound herein referred to means an aggregation of an organic compound not having the sublimation and solubility (preferably, the number of molecules is 10 or less), an organic compound in which the length of chained molecules is 5 μm or less (preferably, 50 nm or less). Moreover, as a film formation method, a vapor deposition method (resistance heating method), spin coating method, ink jet method, printing method or the like can be used. It should be noted that as for the organic compound layer, the patterning could be performed using a metal mask by forming film.

It should be noted that even in the case where the organic compound layer 215 is either of a mono-layer structure or laminated layer structure, it is desirable that its film thickness is in the range of 10 to 300 nm.

Subsequently, on an organic compound layer 215, a mixture region 216 is formed. The mixture region 216 is formed of an organic compound that is used to form the organic compound layer 215 (an organic compound that forms the outer-most surface layer when the organic compound layer has a stacked structure) and a material (metal) for a subsequently formed protection film 217.

For instance, when the organic compound layer 215 has been formed by use of a vapor deposition method, the mixture region 216 is formed by co-depositing the organic compound together with the metal, and when the organic compound layer 215 has been formed by use of a coating method such as a spin-coat method or the like, the mixture region 216 is formed by coating a mixture solution obtained by mixing the metal in a coating liquid.

Figure 17:
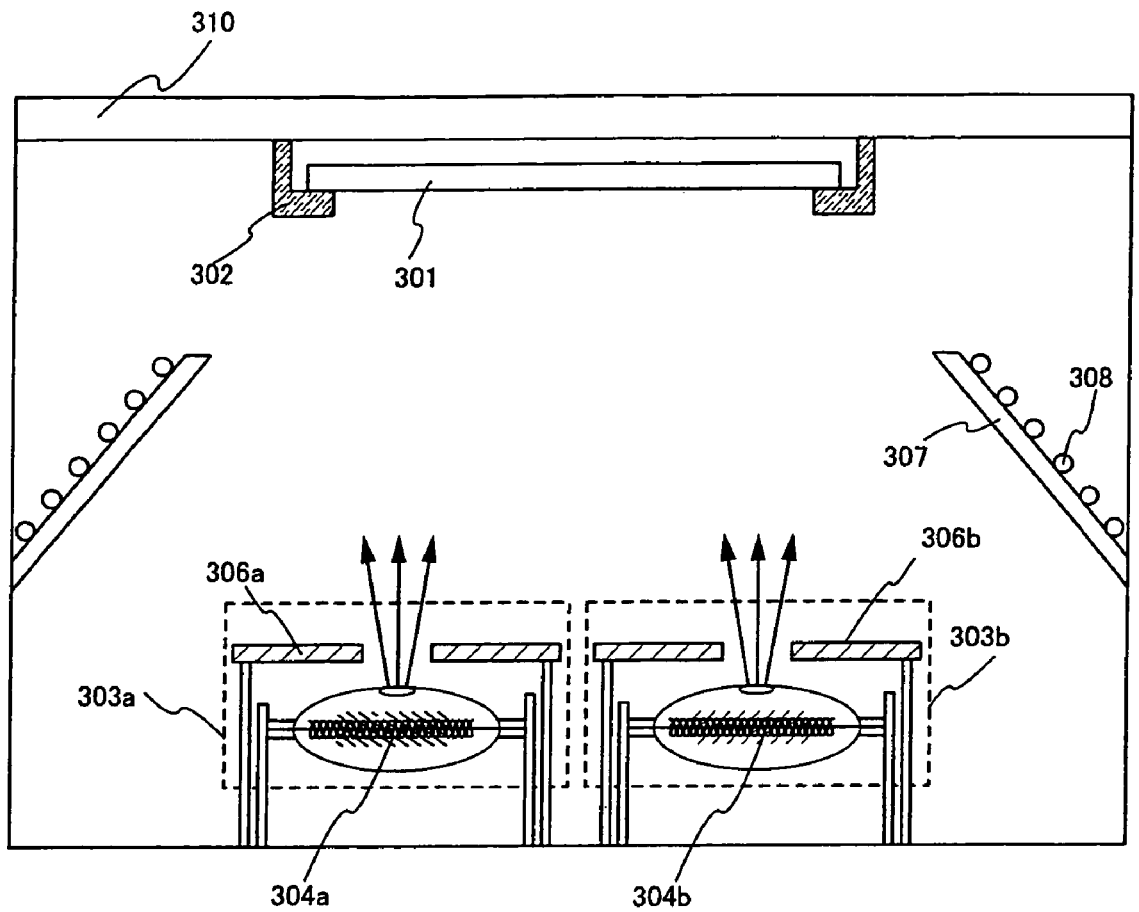
FIG. 17 is a diagram for showing the chamber.
Figure 18:
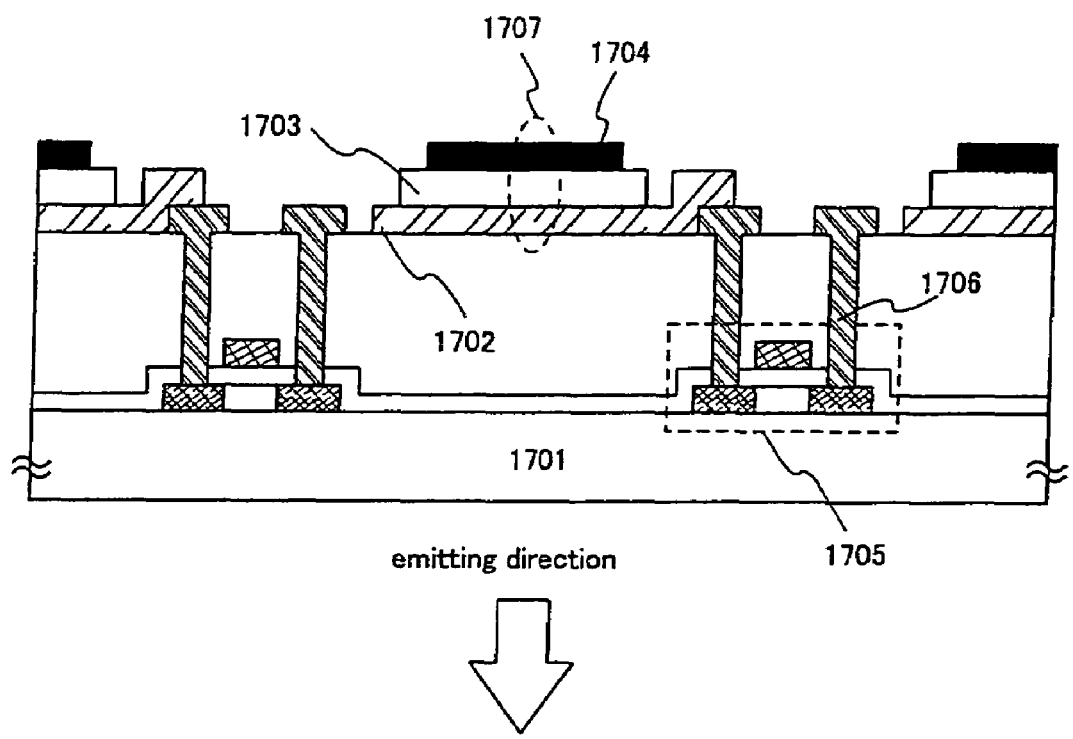
FIG. 18 is a diagram for showing the conventional example.

When the mixture region 216 is formed by use of the vapor deposition method, the vapor deposition is carried out in a vapor deposition chamber as shown in FIG. 17. As shown in FIG. 17, a substrate 301 is fixed to a holder 302, and further a vapor source 303 is disposed downward. A vapor source 303a is provided with an organic compound 304a and a vapor source 303b is provided with a metal 304b is provided. Furthermore, a shutter 306 (306a and 306b) is formed for each of the vapor sources 303 (303a and 303b). In order to form a uniform film in the deposition chamber, the vapor source 303 (303a and 303b) or a substrate being deposited may well be allowed to move (rotate). Although only two vapor sources are shown here, in the case of the organic compound layer having a stacked structure, since a plurality of organic compounds is necessary, a plurality of the vapor sources may be disposed and operated.

Furthermore, the vapor source 303 (303a and 303b) is made of a conductive material, and owing to resistance generated when a voltage is applied thereto, the organic compound 304a or the metal 304b therein is heated, vaporized and deposited on a surface of the substrate 301. The surface of the substrate 301 in the present specification contains the substrate and a thin film formed thereon, and here a TFT, a pixel electrode connected to the TFT and a cathode are formed on the substrate 301.

The shutter 306 (306a and 306b) controls the deposition of the vaporized organic compound 304a or the metal 304b. That is, when the shutter is opened, the heated and vaporized organic compound 304a or metal 304b can be deposited.

Furthermore, in the deposition chamber, a adhesion prevention shield 307 is disposed, and the organic compound that was not deposited on the substrate during the deposition can be allowed to stick thereto. In the surroundings of the adhesion prevention shield 307, a heating wire 308 is disposed to heat an entirety of the adhesion prevention shield 307 and to vaporize the stuck organic compound. Accordingly, the organic compound that was not deposited can be recovered.

For instance, it is assumed that the aforementioned organic compound layer 215 has been formed by depositing an organic compound that is provided to a first vapor source 303a, and a second vapor source 303b is provided with a metal that forms the protection film 217. In this case, by simultaneously depositing (co-depositing) the organic compound provided to the first vapor source 303a and the metal provided to the second vapor source 303b, the mixture region 216 can be formed. A film of the mixture region 216 formed in the present embodiment is formed so as to have an average film thickness in the range of 0.5 to 10 nm, preferably in the range of 1 to 5 nm.

After the mixture region 216 is formed, only the shutter 306a of the first vapor source 303a is closed, and thereby, the protection film 217 formed only of the metal from the second vapor source 303b is formed (FIG. 3B) on the mixture region 216. When the deposition process is continuously performed, impurity contamination at an interface can be suppressed from occurring.

The protection film 217 is formed of a metal that has a work function equal to or more than that of such as ITO or the like for a material of the anode 217 (specifically 4.5 to 5.5 eV). For instance, a metal belonging to 9th, 10th or 11th group in a periodic table such as gold (Au), platinum (Pt), palladium (Pd), or nickel (Ni) can be used to form the protection film 217. Furthermore, the protection film in the present invention is disposed with an intention to inhibit a sputtering damage from being given to the organic compound layer at the deposition of the anode 217. Accordingly, since the protection film may not be necessarily formed uniform and need only secure the transmittance, a conductive film with the visible light transmittance in the range of 70 to 100% may be used to form the protection film with a film thickness in the range of 0.5 to 5 nm.

Furthermore, the anode 218 is formed on the protection film 217 and thereby a light emitting 219 is brought to completion. The anode 218 can be formed, with a transparent conductive film such as IDIXO ($In_2O_3$—ZnO) in addition to ITO and IZO, by use of a sputtering method.

Although in this specification a top gate type TFT is illustrated and explained, the present invention is not restricted to the top gate type TFT, but, in place thereof, a bottom gate type TFT, a forward stagger type TFT and other TFT structure can be applied.

When thus configured, in the organic compound layer 215, luminescence generated through carrier recombination can be efficiently radiated from an anode 218 side.

Figure 4A:
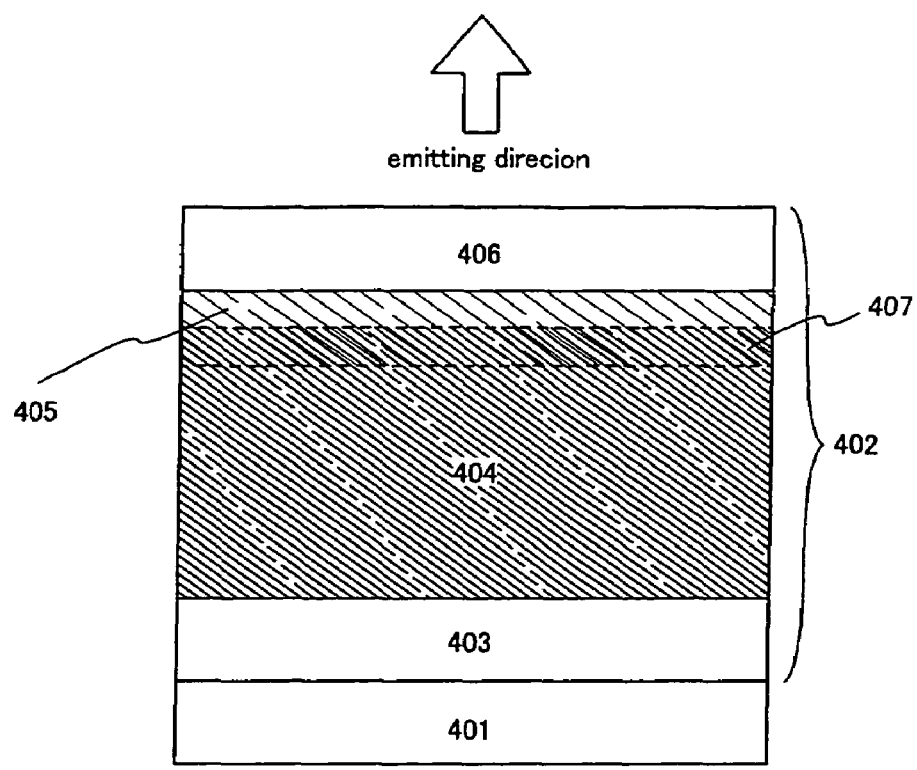
FIGS. 4A and 4B are diagrams for illustrating an element structure of a light emitting device of the present invention.
Figure 4B:
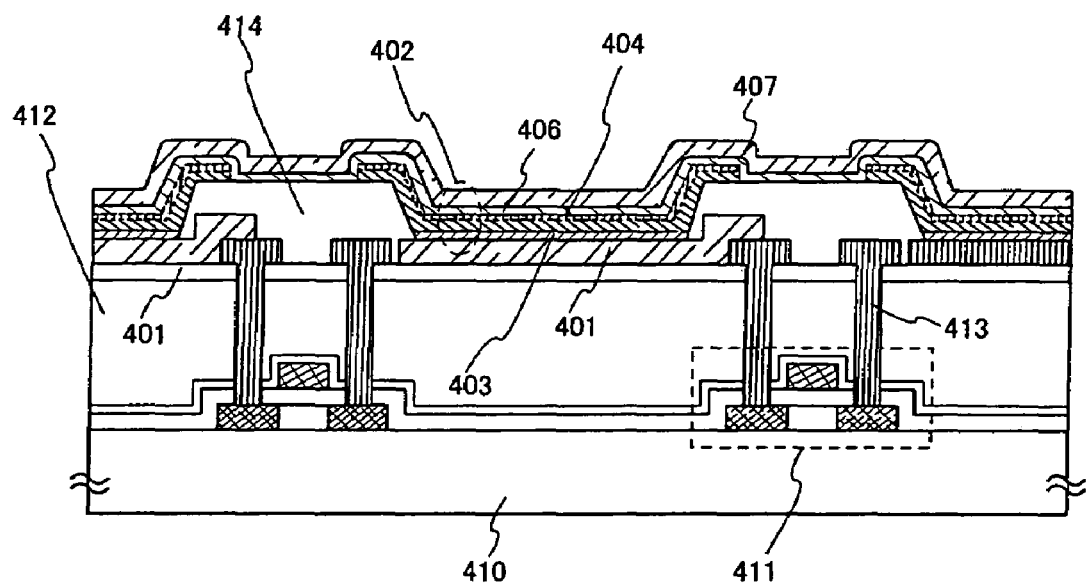

Furthermore, in the light emitting device of the present invention, a structure shown in FIGS. 4A and 4B can be adopted. Though the structure shown in FIG. 4A is different from that shown in FIG. 1A in that the ITO is used to form the pixel electrode 401 and a different cathode material is used, except for these, the explanation in FIGS. 1A and 1B can be referred to the structure in FIGS. 4A and 4B.

Furthermore, in FIG. 4B, an active matrix type light emitting device in which a TFT (it is called also a current control TFT) 411 formed on a substrate 410 and a light emitting 402 shown in FIG. 4A are electrically connected is shown. This has a different structure from that shown in FIG. 1B in that a wiring 413 and a pixel electrode 401 are separately formed and the pixel electrode is made of the ITO. In the case of the structure being formed, in order to inhibit a light from exiting uselessly from the pixel electrode side, a cathode 403 is preferable to be formed light-tightly. Similarly to the case of FIGS. 1A and 1B, as cathode materials, a material that has a small work function (specifically, 3.8 eV or less) and can give light-tightness by forming a thick film can be preferably used.

The light emitting devices of the present invention having the above structures will be more detailed with reference to the following embodiments.

Embodiment 1

Figure 5A:
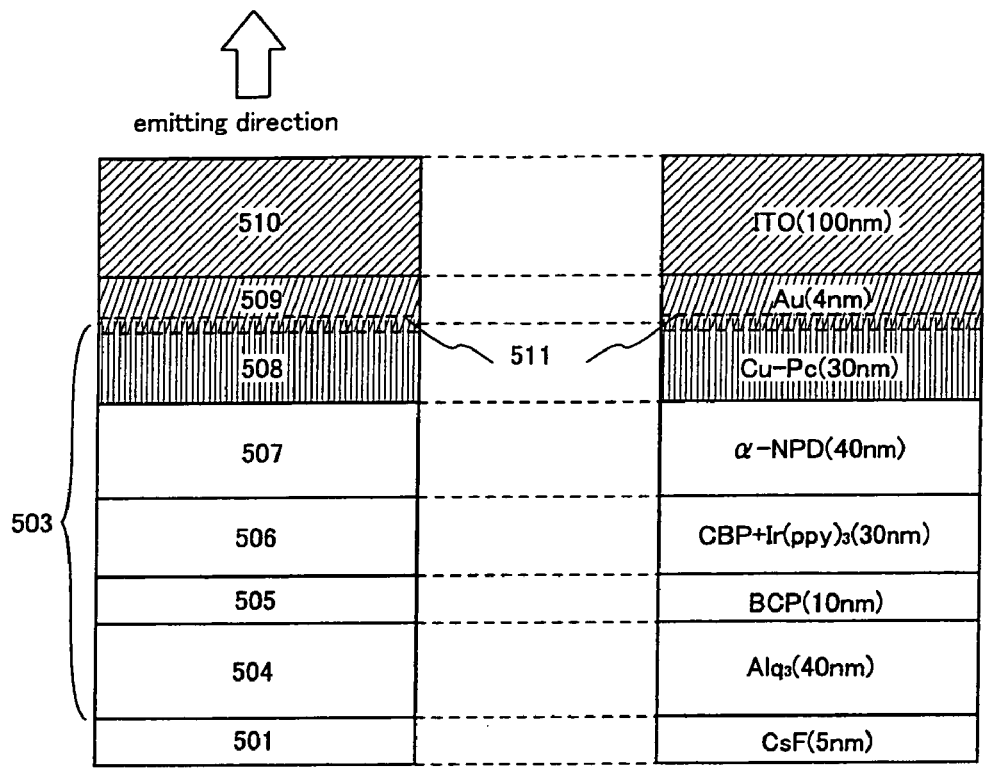
FIGS. 5A and 5B are diagrams for illustrating an element structure of a low-molecular type light emitting device of the present invention.

In the present embodiment, an element structure of a light emitting element that a light emitting device of the present invention has will be described below in detail with reference to FIGS. 5A and 5B. Particularly, the case where it is formed in the organic compound layer using a low molecule based compound will be described below.

As described in Embodiment Mode, a cathode 501 is formed on the pixel electrode. In the present embodiment, the cathode 501 is formed in a film thickness of 5 nm using CsF by an evaporation method Then, an organic compound layer 503 is formed on a cathode 501, but at first, an electron transportation layer 504 is formed. The electron transportation layer 504 is formed using a material capable of performing the electron transportation having the electron acceptability. In the present embodiment, as the electron transportation layer 504, the film is formed using tris(8-quinolinolato)aluminum (hereinafter, abbreviated as $Alq_3$) in a film thickness of 40 nm by an evaporation method.

Furthermore, a blocking layer 505 is formed. The blocking layer 505 is also referred to as a hole inhibition layer, this is a layer for preventing the vain current not involving in the recombination from flowing, in the case where a hole injected into a light emitting layer 506 has passed through the electron transportation layer 504 and reached the cathode 501. In the present embodiment, as a blocking layer 505, it is formed in a film thickness of 10 nm using bathocuproine (hereinafter, abbreviated as BCP) by an evaporation method.

Next, the light emitting layer 506 is formed. In the present embodiment, in a light emitting layer 506, a hole and an electron are recombined and the emitting light is generated. It should be noted that the light emitting layer 506 is formed using 4,4'-dicarbazole-biphenyl (hereinafter, abbreviated as CBP) as a host material having the hole transportation capability, and formed in a film thickness of 30 nm with tris (2-phenylpyridine) iridium $(Ir(ppy)_3)$ which is a light emitting organic compound by performing co-vapor deposition.

Next, a hole transportation layer 507 is formed with a material excellent in hole transportation capability. Here, it is formed in a film thickness of 40 nm using 4,4'-bis[N-(1-naphthyl)-N-phenyl-amino]-biphenyl (hereinafter, abbreviated as α-NPD).

Finally, an organic compound layer 503 having a laminated structure is completed by forming a hole injection layer 508. It should be noted that the hole injection layer 508 has a function for enhancing the injection capability of the hole from the anode. In the present embodiment, as for the hole injection layer 508, it is formed in a film thickness of 30 nm using copper phthalocyanine (Cu-Pc). It should be noted that here it is formed by an evaporation deposition method.

Next, a mixture region 511 is formed by performing co-vapor deposition using a material for a hole injection layer 508 and a protection film to be formed later. In the present embodiment, Cu-Pc and gold are used to form the mixture region 511 by performing the co-vapor deposition in a film thickness of 1 to 2 nm.

Next, a protection film 509 is formed after forming a mixture region 511. It should be noted that as a metal material for forming the protection film 509, concretely, an electrically conductive film having a visible light transmittance in the range of 70 to 100% and whose work function is in the range of 4.5 to 5.5 is used. Moreover, the metal film is often non-transparent with respect to the visible light, it is formed in a film thickness of being in the range of 0.5 to 5 nm. It should be noted that in the present embodiment, it is formed in a film thickness of 4 nm using gold by performing an evaporation method.

Next, an anode 510 is formed. In the present invention, since the anode 510 is an electrode for making the light generated in the organic compound layer 503 pass through, it is formed with a material having a translucency. Moreover, the anode 510 is required to be formed with a material whose work function is large since it is an electrode for injecting a hole into the organic compound layer 503. In the present embodiment, an indium oxide film, a tin (ITO) film, or a transparent electrically conductive film which mixed zinc oxide (ZnO) of 2 to 20% with indium oxide is formed by sputtering in a film thickness of 100 nm is used for forming the anode 510. If a transparent electrically conductive film has a large work function, the anode 510 may be formed by other known materials (IZO, IDIXO and the like).

Figure 5B:
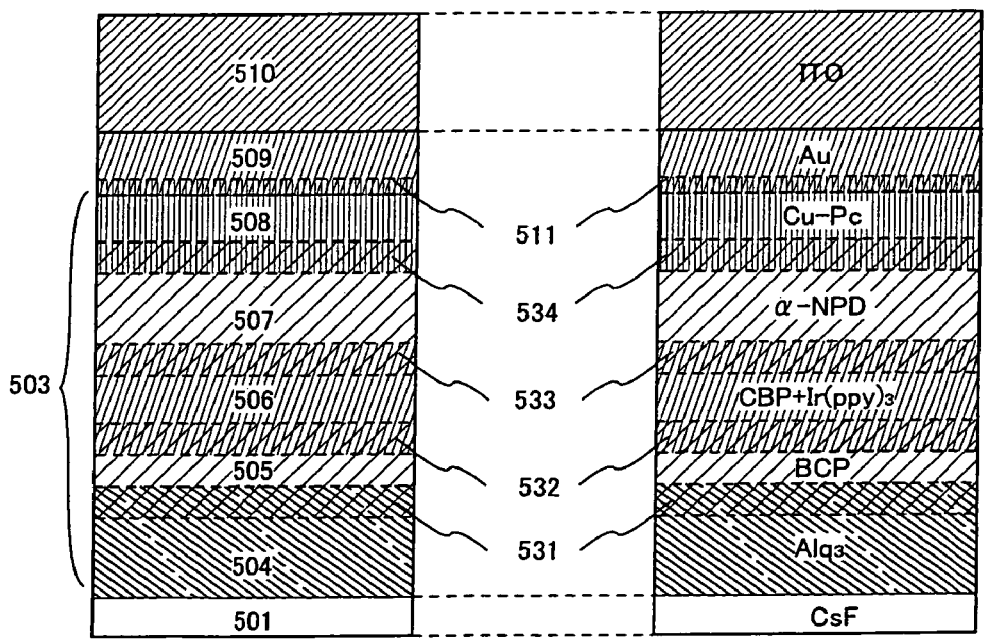

In the present embodiment, as shown in FIG. 5B, a mixed layer may be formed that is formed from materials forming an adjacent layer to interface of the electron transportation layer 504, the blocking layer 505, the light emitting layer 506, the hole transportation layer 507 and the hole injection layer 508 forming the organic compound layer 503.

Concretely, a mixed layer I (531) is formed on the laminated interface between the electron transportation layer 504 and the blocking layer 505, a mixed layer II (532) is formed on the laminated interface between the blocking layer 505 and the light emitting layer 506, a mixed layer III (533) is formed on the laminated interface between the light emitting layer 506 and the hole transportation layer 507, and a mixed layer IV (534) is formed on the laminated interface between the hole transportation 507 and the hole injection layer 508. It should be noted that in the case of the present embodiment, the mixed layer I (531) is formed by performing the co-vapor deposition of $Alq_3$ and BCP, the mixed layer II (532) is formed by performing the co-vapor deposition of BCP, CBP and $(Ir(ppy)_3)$, the mixed layer III (533) is formed by performing the co-vapor deposition of CBP, $(Ir(ppy)_3)$ and α-NPD, and the mixed layer IV (534) is formed by performing the co-vapor deposition of α-NPD and Cu-Pc.

It should be noted that since the embodiment shown in FIG. 5B is a preferable one, it is not necessary to form the mixed layers on all of the laminated interfaces of the organic compound layers, for embodiment, a mixed layer may be formed only on the interface between the blocking layer 505 and the hole transportation layer 507 which are in contact with the light emitting layer 506.

Thus, a light emitting element formed using a low molecular compound based material for the organic compound layer can be formed.

Embodiment 2

Figure 6A:
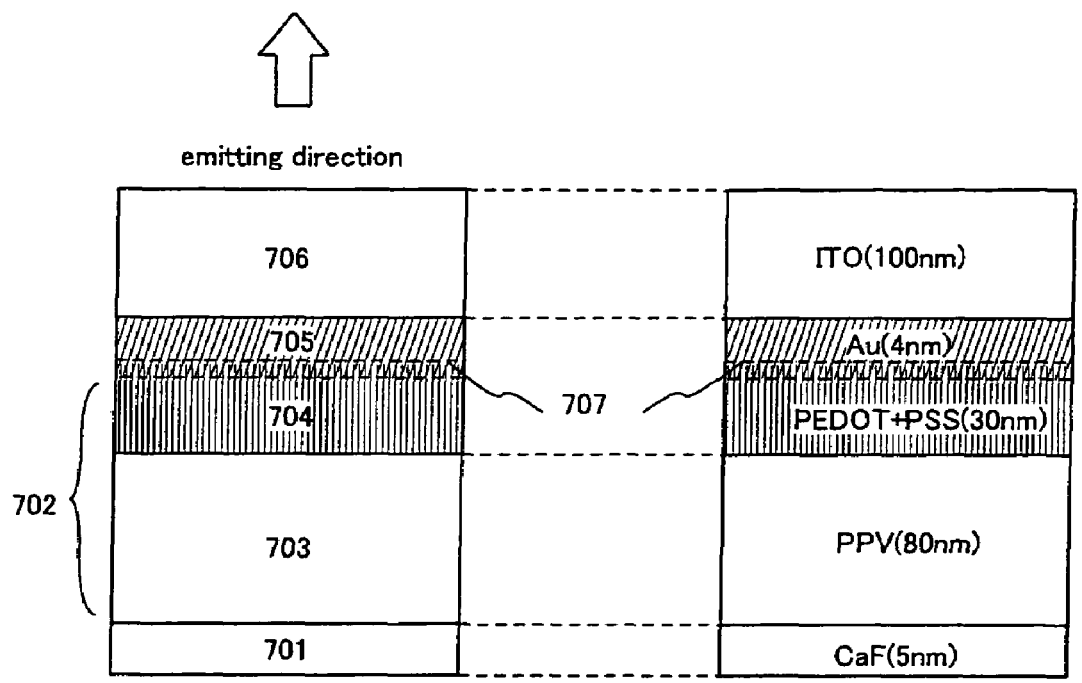
FIGS. 6A and 6B are diagrams for illustrating an element structure of a high-molecular type light emitting device of the present invention.
Figure 6B:
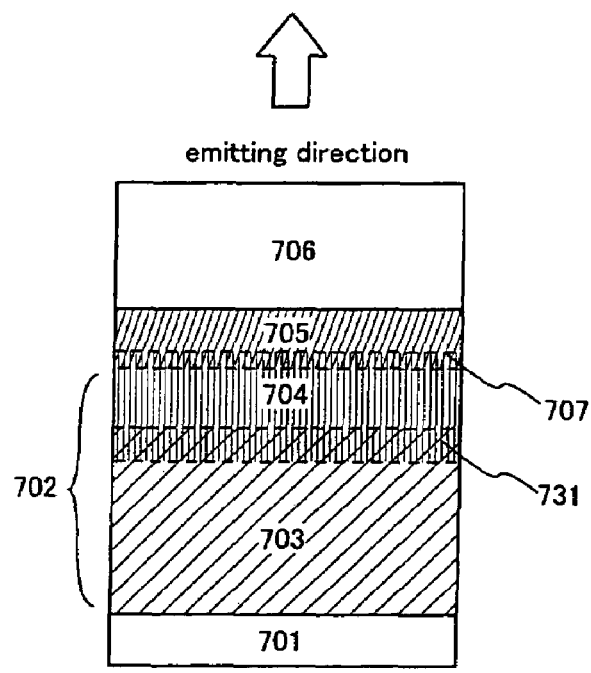

The present embodiment gives a detailed description on the element structure of a light emitting element in a light emitting device of the present invention with reference to FIGS. 6A to 6C. Specifically, the element structure in which a high-molecular based compound is used for an organic compound layer will be described.

As described in Embodiment Mode, a cathode 701 is formed on the pixel electrode. The cathode 701 in the present embodiment is formed of CaF by evaporation to a thickness of 5 nm.

Further, an organic compound layer 702 is a lamination structure from a light emitting layer 703 and a hole transporting layer 704 in this embodiment. The organic compound layer 702 is formed by using high-molecular based organic compound.

The light emitting layer 703 may formed by using materials of poly p-phenylene vinylene, poly p-phenylene, polythiophene, or polyfluorene type.

As the poly p-phenylene vinylene type material, the following can be used: poly(p-phenylene vinylene), referred to as PPV hereinafter, or poly[2-(2'-ethylhexoxy)-5-methoxy-1, 4-phenylene vinylene], referred to as MEH-PPV hereinafter, each of which can give orange luminescence; poly[2-(dialkoxyphenyl)-1,4-phenylene vinylene], referred to as ROPh-PPV, which can give green luminescence; or the like.

As the polyparaphenylene type material, the following can be used: poly(2,5-dialkoxy-1,4-phenylene), referred to as RO-PPP hereinafter, poly(2,5-dihexoxy-1,4-phenylene), each of which can give blue luminescence; or the like.

As the polythiophene type material, the following can be used: poly(3-alkylthiophene), referred to as PAT hereinafter, poly(3-hexylthiophene), referred to as PHT hereinafter, poly(3-cyclohexylthiophene), referred to as PCHT hereinafter, poly(3-cyclohexyl-4-methylthiophene), referred to as PCHMT hereinafter, poly(3,4-dicyclohexylthiophene), referred to as PDCHT hereinafter, poly[3-(4-octylphenyl)-thiophene], referred to as POPT hereinafter, or poly[3-(4-octylphenyl)-2,2-bithiophene], referred to as PTOPT hereinafter, each of which can give red luminescence; or the like.

As the polyfluorene type material, the following can be used: poly(9,9-dialkylfluorene), referred to as PDAF hereinafter, or poly(9,9-dioctylfluorene), referred to as PDOF hereinafter, each of which can give blue luminescence; or the like.

The above-mentioned material which can form a light emitting layer is dissolved in an organic solvent, and then the solution is applied by any coating method. Embodiments of the organic solvent used herein include toluene, benzene, chlorobenzene, dichlorobenzene, chloroform, tetralin, xylene, dichloromethane, cyclohexane, NMP (N-methyl-2-pyrrolidone), dimethylsulfoxide, cyclohexanone, dioxane, THF (tetrahydrofuran) and the like.

In this embodiment, the film made of PPV as a light emitting layer 703 is formed to have a thickness of 80 nm.

The hole transport layer 704 can be formed using both of poly(3,4-ethylene dioxythiophene), referred to as PEDOT hereinafter, and polystyrene sulfonic acid, referred to as PSS hereinafter, which is an acceptor material, or both of polyaniline, referred to as PANI hereinafter, and a camphor sulfonic acid, referred to as CSA hereinafter. The material is made into an aqueous solution since the material is water-soluble, and then the aqueous solution is applied by any coating method so as to form a film. In the present embodiment, a film composed of PEDOT and PSS is formed as the hole transport layer 704 to have a thickness of 30 nm. Thus, the organic compound layer 702 can be obtained that is a lamination of the light emitting layer 703 and the hole transporting layer 704.

Next, a mixture region 707 is formed by a coating a coating liquid that is a mixture of materials for the protection film which is formed later and the coating liquid for the hole transportation layer 704. In the present embodiment, the mixture region 707 is formed in a film thickness of 1 to 2 nm by coating a coating liquid a mixture of gold and the aqueous solution containing PEDOT and PSS material.

Next, a protection film 705 is formed after forming a mixture region 707. It should be noted that as a metal material for forming a protection film 705, concretely, an electrically conductive film having a visible light transmittance in the range of 70 to 100% and whose work function is in the range of 4.5 to 5.5 is used. Moreover, the metal film is often opaque with respect to the visible light, it is formed in a film thickness of being in the range of 0.5 to 5 nm. It should be noted that in the present embodiment, it is formed in a film thickness of 4 nm using gold by the evaporation method.

Next, an anode 706 is formed. In the present invention, since the anode 706 is an electrode for making the light generated in the organic compound layer 702 pass through, it is formed with a material having a translucency. Moreover, the anode 706 is required to be formed with a material whose work function is large since it is an electrode for injecting a hole into the organic compound layer 702. In the present embodiment, an indium oxide film, a tin (ITO) film, or a transparent electrically conductive film which mixes zinc oxide (ZnO) of 2 to 20% with indium oxide is used to form the anode 706 of 100 nm in thickness by sputtering. If a transparent electrically conductive film has a large work function, the anode 706 may be formed by known other materials (IZO, IDIXO and the like).

It should be noted that in the present embodiment, as shown in FIG. 6B, a mixed layer 731 may be formed that is formed from materials forming an adjacent layer to interface between the light emitting layer 703 forming the organic compound layer 702 and the hole transporting layer 704.

Thus, the light emitting element formed by using high-molecular based materials to the organic compound layer may be formed.

Embodiment 3

Embodiments of the present invention will be described with references to FIG. 7A to 10B. Here, a detailed description will be given on a method of manufacturing a pixel portion and TFTs (n-channel TFTs and p-channel TFTs) of a driving circuit that are provided in the periphery of the pixel portion are formed on the same substrate at the same time.

The base insulating film 601 is formed on the substrate 600 to obtain the first semiconductor film having a crystal structure. Subsequently, isolated in island-shape semiconductor layer 602 to 605 is formed by conducting etching treatment to the desired shape.

As a substrate 600, the glass substrate (# 1737) is used. As a base insulating film 601, a silicon oxynitride film 601a is formed as a lower layer of a base insulating film on the silicon oxide film by plasma CVD at a temperature of 400° C. using SiH$_4$, NH$_3$, and N$_2$O as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film 601b is formed as an upper layer of the base insulating film by plasma CVD at a temperature of 400° C. using SiH$_4$ and N$_2$O as material gas (the composition ratio of the silicon oxynitride film: Si=32%, O=59%, N=7%, H=2%). The silicon oxynitride film 601b has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using SiH$_4$ as material gas. The semiconductor film is 54 nm (preferably 25 to 80 nm) in thickness.

A base film 601 in this embodiment has a two-layer structure. However, the base insulating film may be a single layer or more than two layers of insulating films. The material of the semiconductor film is not limited but it is preferable to form the semiconductor film from silicon or a silicon germanium alloy (Si$_x$Ge$_{1-x}$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dose to $2\times10^{12}/cm^2$.

Next, a nickel acetate solution containing 10 ppm of nickel by weight is applied by a spinner. Instead of application, nickel may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time. The present embodiment employs a crystallization technique in which nickel is used as a metal element for accelerating crystallization of silicon. However, other known crystallization techniques, solid phase growth and laser crystallization, for example, may be employed.

An oxide film on the surface of the silicon film having a crystal structure is removed by diluted fluoric acid or the like. Then, in order to enhance the crystallization rate and repair defects remaining in crystal grains, the silicon film is irradiated with laser light (XeCl, the wavelength: 308 nm) in the air or in an oxygen atmosphere. The laser light may be excimer laser light having a wavelength of 400 nm or less, or the second harmonic or third harmonic of a $YVO_4$ laser. Pulse laser light having a repetition frequency of 10 to 1000 Hz is employed. The laser light is collected by an optical system to have an energy density of 100 to 500 $mJ/cm^2$ and scans the silicon film surface at an overlapping ratio of 90 to 95%. Here, the film is irradiated with laser light at a repetition frequency of 30 Hz and an energy density of 393 $mJ/cm^2$ in the air. The oxide film is formed on the surface by irradiating the laser light because the laser irradiation is employed in the oxygen atmosphere.

After removing an oxide film formed during irradiating the laser light by using hydrofluoric acid, the second laser light is irradiated in a nitrogen atmosphere or vacuum atmosphere to smooth the surface of the semiconductor film. Excimer laser light with a wavelength equal to or less than 400 nm, or the second or the third harmonic of a YAG laser, is used for the laser light (the second laser light). Note that the energy density of the second laser light is made larger than that of the first laser light, preferably from 30 to 60 $mJ/cm^2$ larger.

Laser light irradiation at this point is very important because it is used to form an oxide film to prevent doping of the silicon film having a crystal structure with a rare gas element in later film formation by sputtering and because it enhances the gettering effect. The oxide film formed by this laser light irradiation and an oxide film formed by treating the surface with ozone water for 120 seconds together make a barrier layer that has a thickness of 1 to 5 nm in total.

Next, an amorphous silicon film containing argon is formed on the barrier layer by sputtering to serve as a gettering site. The thickness of the amorphous silicon film is here 150 nm. The conditions for forming the amorphous silicon film here include setting the film formation pressure to 0.3 Pa, the gas (Ar) flow rate to 50 sccm, the film formation power to 3 kW, and the substrate temperature to 150° C. The atomic concentration of argon contained in the amorphous silicon film formed under the above conditions is $3\times10^{20}$ to $6\times10^{20}/cm^3$ and the atomic concentration of oxygen thereof is $1\times10^{19}$ to $3\times10^{19}/cm^3$. Thereafter, heat treatment is conducted in a lamp annealing apparatus at 650° C. for 3 minutes for gettering.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is preferable to remove the barrier layer that is an oxide film after gettering.

Next, a thin oxide film is formed on the surface of the obtained silicon film containing a crystal structure (also referred to as a polysilicon film) using ozone water. A resist mask is then formed and the silicon film is etched to form island-like semiconductor layers separated from one another and having desired shapes. After the semiconductor layers are formed, the resist mask is removed.

Also, after forming a semiconductor layer, in order to control the threshold (Vth) of the TFTs, the semiconductor layers may be doped with an impurity element that gives the p-type or n-type conductivity. Impurity elements known to give a semiconductor the p type conductivity are Group 13 elements in the periodic table, such as boron (B), aluminum (Al), and gallium (Ga). Impurity elements known to give a semiconductor the n type conductivity are Group 15 elements in the periodic table, such as phosphorus (P) and arsenic (As).

Next, a thin oxide film is formed from ozone water on the surface of the obtained silicon film having a crystal structure (also called a polysilicon film). A resist mask is formed for etching to obtain semiconductor layers 602 to 605 having desired shapes and separated from one another like islands. After the semiconductor layers are obtained, the resist mask is removed.

The oxide film is removed by an etchant containing fluoric acid, and at the same time, the surface of the silicon film is washed. Then, an insulating film mainly containing silicon is formed to serve as a gate insulating film 607. For forming the gate insulating film 607, a lamination film formed by a silicon oxide film and silicon nitride film which are formed by sputtering method with Si as a target, a silicon oxynitride film which is formed by plasma CVD method, and silicon oxide film may be used. The gate insulating film here is a silicon oxynitride film (composition ratio: Si=32%, O=59%, N=7%, H=2%) formed by plasma CVD to have a thickness of 115 nm.

As shown in FIG. 7A, a first conductive film 608 with a thickness of 20 to 100 nm and a second conductive film 609 with a thickness of 100 to 400 nm are layered on the gate insulating film 607. In the present embodiment, a 50 nm thick tantalum nitride film and a 370 nm thick tungsten film are layered on the gate insulating film 607 in the order stated.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films.

The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer film may be used.

As shown in FIG. 7B, resist masks 610 to 613 are formed by light exposure to conduct the first etching treatment for forming gate electrodes and wiring lines. The first etching treatment is conducted under first and second etching conditions. ICP (Inductively Coupled Plasma) etching is employed. The films can be etched into desired taper shapes by using ICP etching and adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Under the first etching conditions, the rate of etching the W film is 200.39 nm/min. and the rate of etching the TaN film is 80.32 nm/min. The selective ratio of W to TaN is therefore about 2.5. The W film is tapered under the first etching conditions at an angle of about 26°. Thereafter, the first etching conditions are switched to the second etching conditions without removing the resist masks 610 to 613. The second etching conditions include using $CF_4$ and $Cl_2$ as etching gas, setting the gas flow rate ratio thereof to 30/30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions including the use of a mixture of $CF_4$ and $Cl_2$, the TaN film and the W film are etched to about the same degree. The rate of etching the W film is 58.97 nm/min. and the rate of etching the TaN film is 66.43 nm/min. under the second etching conditions. In order to etch the films without leaving any residue on the gate insulating film, the etching time is prolonged by approximately 10 to 20%.

In the first etching treatment, first conductive layers and second conductive layers are tapered around the edges by forming the resist masks into proper shapes and by the effect of the bias voltage applied to the substrate side. The angle of the tapered portions may be 15 to 45°.

The first shape conductive layers 615 to 618 (the first conductive layers 615a to 618a and the second conductive layers 615b to 618b) are formed that is consisted of the first conductive layer and the second conductive layer by the first etching treatment. The insulating film 607 to be a gate insulating film is etched 10 to 20 nm, to form a gate insulating film 620 having a region becoming thin where the first shape conductive layers 615 to 618 do not overlap.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 620 is 33.7 nm/min, and a selection ratio of W to SiON is 6.83. In the case where $SF_6$ is used as the etching gas, the selection ratio with respect to the insulating film 620 is high as described above. Thus, reduction in the film thickness can be suppressed. In the present embodiment, the film thickness of the insulating film 620 is reduced by only about 8 nm.

By the second etching process, the taper angle of W becomes 70°. By the second etching process, second conductive layers 621b to 624b are formed. On the other hand, the first conductive layers are hardly etched to become first conductive layers 621a to 624a. Note that the first conductive layers 621a to 624a have substantially the same size as the first conductive layers 615a to 615a. In actuality, the width of the first conductive layer may be reduced by approximately 0.3 μm, namely, approximately 0.6 μm in the total line width in comparison with before the second etching process. However, there is almost no change in size of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coiled electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHz) power of 20 W is also applied to the substrate side (sample stage); and RF (13.56 MHz) power of 500 W is applied to a coiled electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coiled electrode with a pressure of 1.2 Pa to generate plasma, thereby performing etching.

Next, the masks made of resist are removed, and then, a first doping process is conducted to obtain the state of FIG. 8A. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 621 to 624 become masks against the impurity element imparting n-type conductivity, and first impurity regions 626 to 629 are formed in a self-aligning manner. The impurity element imparting n-type conductivity is added to the first impurity regions 626 to 629 in a concentration range of $1\times10^{16}$ to $1\times10^{17}/cm^3$. Here, the region having the same concentration range as the first impurity region is also called an n⁻ region.

Note that although the first doping process is performed after the removal of the masks made of resist in the present embodiment, the first doping process may be performed without removing the masks made of resist.

Subsequently, as shown in FIG. 8B, masks 631 and 632 made of resist are formed, and a second doping process is conducted. The mask 631 is a mask for protecting a channel forming region and a periphery thereof of a semiconductor layer forming a p-channel TFT of a driver circuit, the mask 632 is a mask for protecting a channel forming region and a periphery thereof of a semiconductor layer forming a TFT (switching TFT) of a pixel portion.

With the ion doping conditions in the second doping process: a dosage of $1.5\times10^{15}$ atoms/cm²; and an accelerating voltage of 60 to 100 keV, phosphorous (P) is doped. Here, impurity regions are formed in the respective semiconductor layers in a self-aligning manner with the second conductive layer 621b as a mask. Of course, phosphorous is not added to the regions covered by the masks 631 and 632. Thus, second impurity regions 634 to 636 and a third impurity regions 637 and 639 are formed. The impurity element imparting n-type conductivity is added to the second impurity regions 634 to 636 in a concentration range of $1\times10^{20}$ to $1\times10^{21}/cm^3$. Here, the region having the same concentration range as the second impurity region is also called an n⁺ region.

Further, the third impurity region is formed at a lower concentration than that in the second impurity region by the first conductive layer, and is added with the impurity element imparting n-type conductivity in a concentration range of $1\times10^{18}$ to $1\times10^{19}/cm^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n⁻ region. Furthermore, the regions covered by the mask 632 are not added with the impurity element in the second doping process, and become first impurity region 638.

Next, after the masks 631 and 632 made of resist are removed, masks 639, 640, and 633 made of resist are newly formed, and a third doping process is conducted as shown in FIG. 8C.

In the driver circuit, by the third doping process as described above, fourth impurity region 641 and fifth impurity region 643 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity region 641 in a concentration range of $1\times10^{20}$ to $1\times10^{21}/cm^3$. Note that, in the fourth impurity region 641, phosphorous (P) has been added in the preceding step (n⁻ region), but the impurity element imparting p-type conductivity is added at a concentration that is 1.5 to 3 times as high as that of phosphorous. Thus, the fourth impurity region 641 have a p-type conductivity. Here, the region having the same concentration range as the fourth impurity region is also called a p⁺ region.

Further, fifth impurity region 643 are formed in regions overlapping the tapered portion of the second conductive layer 125a, and are added with the impurity element imparting p-type conductivity in a concentration range of $1\times10^{18}$ to $1\times10^{20}/cm^3$. Here, the region having the same concentration range as the fifth impurity region is also called a p⁻ region.

Through the above-described steps, the impurity regions having n-type or p-type conductivity are formed in the respective semiconductor layers. The conductive layers 621 to 624 become gate electrodes of a TFT.

Next, an insulating film (not shown) that covers substantially the entire surface is formed. In the present embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in the present embodiment, a step of forming the insulating film may be conducted after the activation is conducted.

Next, a first interlayer insulating film 645 is formed of a silicon nitride film, and heat treatment (300 to 550° C. for 1 to 12 hours) is performed, thereby conducting a step of hydrogenating the semiconductor layers. (FIG. 9A) The first interlayer insulating film 645 may be a lamination structure consisting of the silicon nitride oxide film and the silicon nitride film. This step is a step of terminating dangling bonds of the semiconductor layers by hydrogen contained in the first interlayer insulating film 645. The semiconductor layers can be hydrogenated irrespective of the existence of an insulating film (not shown) formed of a silicon oxide film. Incidentally, in the present embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 646 is formed from an organic resin material on the first interlayer insulating film 645. In the present embodiment, an acrylic resin film with a thickness of 1.6 μm is formed.

Furthermore, in order to prevent degassing such as oxygen, emission of moisture, and the like, generated from the inside of a layer insulation film on the second interlayer insulating film 646, the barrier film 647 is formed. Specifically, the insulating film which contains aluminum, such as nitride aluminum (AlN), a nitride aluminum oxide (AlNO), oxidization nitride aluminum (AlNO), nitride silicon (SiN), and nitride oxidization silicon (SiNO), or silicon may be used to form the barrier film to have a thickness of 0.2 to 1 μm. In the present embodiment, the barrier film which consists of nitride silicon is formed to have a thickness of 0.3 μm by the sputtering method. In addition, as a sputtering method used here, there is the 2 pole sputtering method, an ion beam sputtering method, the opposite target sputtering method and the like.

Then, a contact hole that reaches each impurity region. In the present embodiment, a plurality of etching processes are sequentially performed. In the present embodiment, the second interlayer insluting film is etched with the first interlayer insulating film as the etching stopper, the first interlayer insulating film is etched with the insulating film (not shown) as the etching stopper, and then, the insulating film (not shown) is etched.

Thereafter, wirings are formed by using Al, Ti, Mo, W and the like. Depending on the circumstances, the pixel electrode of light emitting element that is formed to contact the wiring can be formed at the same time. As the material of the electrodes and pixel electrode, it is preferable to use a material excellent in reflecting property, such as a film containing Al or Ag as its main constituent or a lamination film of the above film. Thus, wirings 650 to 657 are formed.

As described above, a driver circuit 705 having an n-channel TFT 701 and a p-channel TFT 702, and pixel portion 706 having a switching TFT 703 made from an n-channel TFT and a current control TFT 704 made from an n-channel TFT can be formed on the same substrate. (FIG. 9C) In the present specification, the above substrate is called an active matrix substrate for the sake of convenience.

In the pixel portion 706, the switching TFT 703 (n-channel TFT) has a channel forming region 503, the first impurity region ($n^-$ region) 638 formed outside the conductive layer 623 forming the gate electrode, and the second impurity region ($n^+$ region) 635 functioning as a source or drain region.

In the pixel portion 706, the current control TFT 704 (n-channel TFT) has a channel forming region 504, the third impurity region ($n^-$ region) 639 that overlaps a part of the conductive layer 624 forming the gate electrode through an insulating film, and the second impurity region ($n^+$ region) 636 functioning as a source or drain region.

Further, in the driver circuit 705, the n-channel TFT 701 has a channel forming region 501, the third impurity region ($n^-$ region) 637 that overlaps a part of the conductive layer 621 forming the gate electrode through the insulating film, and the second impurity region ($n^+$ region) 634 functioning as a source region or a drain region.

Further, in the driver circuit 705, the p-channel TFT 702 has a channel forming region 502, the fifth impurity region ($p^-$ region) 643 that overlaps a part of the conductive layer 622 forming the gate electrode through the insulating film, and the fourth impurity region ($p^+$ region) 641 functioning as a source region or a drain region.

The above TFTs 701 and 702 are appropriately combined to form a shift resister circuit, a buffer circuit, a level shifter circuit, a latch circuit and the like, thereby forming the driver circuit 705. For example, in the case where a CMOS circuit is formed, the n-channel TFT 701 and the p-channel TFT 702 may be complementarily connected to each other.

Moreover, the structure of the n-channel TFT 701, which is a GOLD (Gate-drain Overlapped LDD) structure that is formed by overlapping a LDD (Lightly Doped Drain) region with a gate electrode, is appropriate for the circuit in which the reliability takes top priority.

Note that the TFT (n-channel TFT and p-channel TFT) in the driver circuit 705 are required to have a high driving capacity (on current: Ion) and prevent deterioration due to a hot carrier effect to thereby improve reliability. A TFT having a region (GOLD region) where a gate electrode overlaps a low concentration impurity region through a gate insulating film is used as a structure effective in preventing deterioration of an on current value due to hot carriers.

Note that the switching TFT 703 in the pixel portion 706 requires a low off current (Ioff). A structure having a region (LDD region) where a gate electrode does not overlap a low concentration impurity region through a gate insulating film is used as a TFT structure for reducing an off current.

Next, an insulating film is formed. As the insulating material containing silicon, silicon oxide, silicon nitride, or silicon oxide nitride may be used. As the organic resin, polyimide (including photosensitive polyimide), polyamide, acrylic (including photosensitive acrylic), BCB (benzocyclobutene), or the like may be used.

Figure 10A:
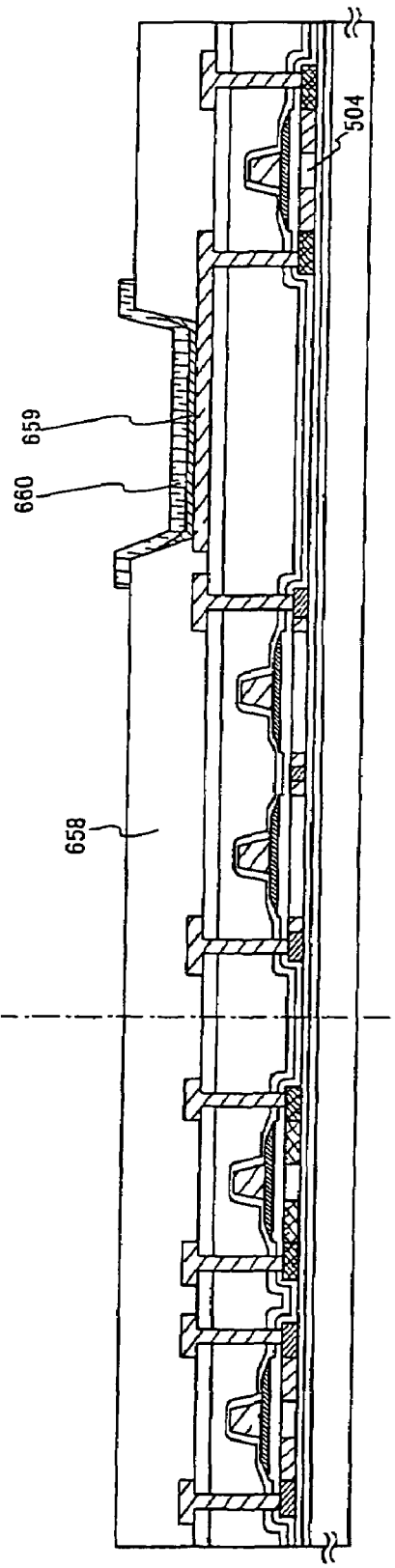
FIGS. 10A and 10B are diagrams for illustrating a manufacturing step of a light emitting device of the present invention.

The opening portion is formed at the corresponding portion to the pixel electrode 657 of the insulating film to form the insulating film 658 (FIG. 10A). In addition, an insulating film is formed using a photosensitive polyimide to have a thickness of 1 μm, and after conducting a patterning by photolithography method the insulating film 658 is formed by conducting an etching treatment.

On the exposed pixel electrode 657 in the opening portion of the insulating layer 658, a cathode 659 is patterned to form by an evaporation method using metal masks. For a specific cathode material, it is preferable to be formed by using a small work function materials to improve injection of electron, such as alkali metals, materials belonging to alkaline earth metals, elementary substances of transition metals including rare-earth metals, or to be laminated with other materials, to be formed by using compounds composing of other materials (for example, CsF, BaF, CaF, and the like), and to be formed by using alloys composing of other materials (for example, Al: Mg alloy, Mg: In alloy, and the like). In the present embodiment, the cathode may be formed by using CsF to have a thickness of 5 nm. The organic compound layer 660 is formed by conducting evaporation method using metal masks on the cathode 659 (FIG. 10A). Here, formation of one kind of organic compound layer is described that is formed by organic compounds emitting three kinds of light, red, green, and blue. Detained description of organic compounds forming three kinds of organic compound layer is the following.

First, an organic compound layer emitting red light is formed. Specifically, a tris (8-quinolinolatoA) aluminum (hereinafter referred to as the $Alq_3$) as an electron transporting organic compound is formed into the electron transporting layer in a 40 nm film thickness. A basocuproin (hereinafter referred to as the BCP) as a blocking organic compound is formed into a blocking layer in a 10 nm film thickness. A 2,3,7,8,12,13,17,18-octaethyl-21H, 23H-porphyrin-platinum (hereinafter referred to as the PtOEP) as a light emitting organic compound is performing a co-vapor deposition to form the light emitting layer with organic compounds (hereinafter referred to as the host materials) a 4,4'-dicarbazol-biphenyl (hereinafter referred to as the CBP) to serve as the host in a 30 nm film thickness. A 4,4'-bis[N-(1-naphthyl)-N-phenyl-amino]-biphenyl (hereinafter referred to as the α-NPD) as a hole transporting organic compound is formed into a hole transporting layer in a 40 nm film thickness. Thereby, a red light emitting organic compound layer can be formed.

Although the case of forming a red light emitting organic compound layer using 5 kinds of organic compounds with different functions is explained here, the present invention is not limited thereto, and known materials can be used as the organic compound showing the red luminescence.

A green light emitting organic compound layer is formed. Specifically, an $Alq_3$ as an electron transporting organic compound is formed into the electron transporting layer in a 40 nm film thickness. A BCP as a blocking organic compound is formed into the blocking layer in a 10 nm film thickness. The light emitting layer is formed by that a CBP used as a hole transmitting host material is performed the co-vapor deposition with a tris(2-phenyl pyridine)iridium ($Ir(ppy)_3$) in a 30 nm film thickness. An α-NPD as a hole transporting organic compound is formed in the hole transporting layer in a 40 nm film thickness. Thereby, a green light emitting organic compound layer can be formed.

Although the case of forming a green light emitting organic compound layer using 4 kinds of organic compounds with different functions is explained here, the present invention is not limited thereto, and known materials can be used as the organic compound showing the green luminescence.

A blue light emitting organic compound layer is formed. Specifically, an Alq₃ as an electron transporting organic compound is formed into the electron transporting layer in a 40 nm film thickness. A BCP as a blocking organic compound is formed into the blocking layer in a 10 nm film thickness. An α-NPD as a light emitting organic compound and a hole transporting organic compound is formed into the light emitting layer in a 40 nm film thickness. Thereby, a blue light emitting organic compound layer can be formed.

Although the case of forming a blue light emitting organic compound layer using 3 kinds of organic compounds with different functions is explained here, the present invention is not limited thereto, and known materials can be used as the organic compound showing the blue light emission.

By forming the above-mentioned organic compounds on the anode, an organic compound layer emitting the red luminescence, the green luminescence and the blue luminescence can be formed in the pixel portion.

Figure 10B:
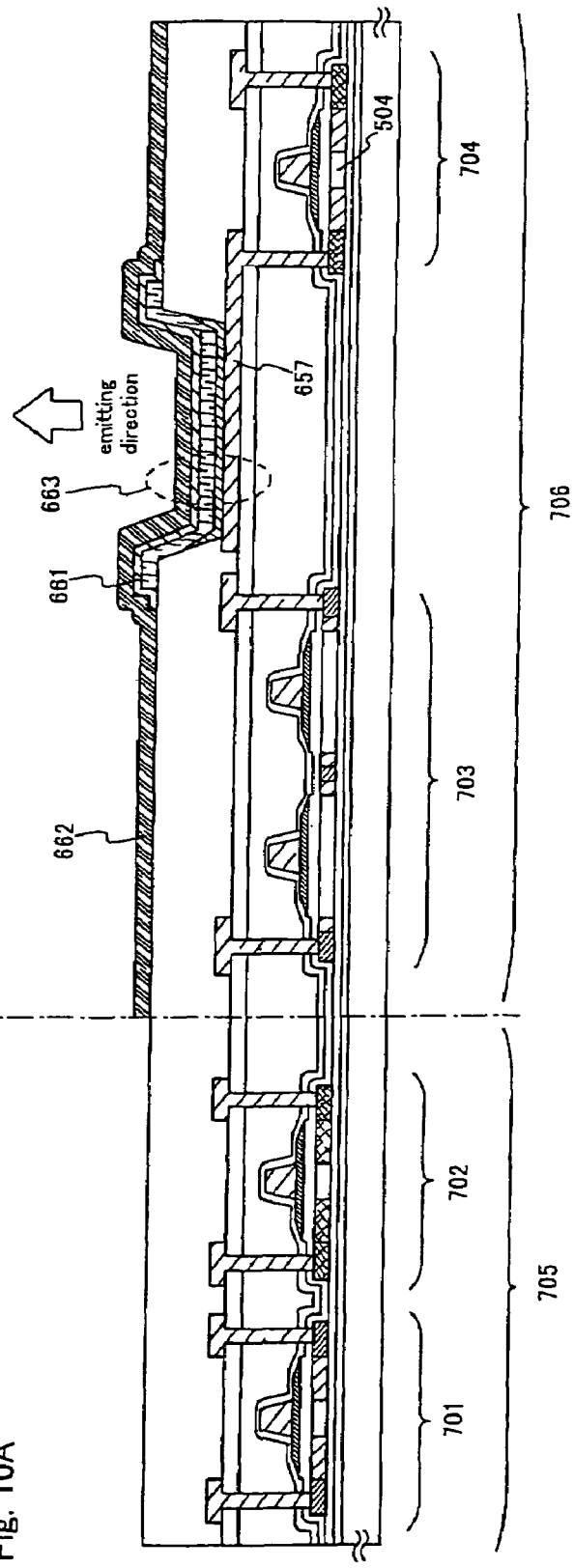

The mixture region is formed by performing the co-vapored deposition with the material of forming the organic compound layer 660 on the above-mentioned each organic compound layer and the material of the protection film 661. In FIG. 10B, the mixture region is shown by the dashed line at the interface of the organic compound layer and the protection film. The mixture region is formed in the film thickness of 1 to 2 nm by overlapping the organic compound layer 660 and the insulating layer 658. For example, the mixture region is formed by performing the co-vapor deposition of an a-NPD and gold in case that a red light emitting organic compound layer is formed and gold is used as the metallic material of forming the protection film 661.

The protection film 661 is formed on the mixture region. In addition, as the metal material forming the protection film 661, the conductive film having 70 to 100% of transmittance to the visible light, and 4.5 to 5.5 of work function may be used. There are many metal films do not transparent to the visible light, so that the thickness of the protection film is formed to have a thickness of 0.5 to 5 nm. In the present embodiment, the protection film is formed of gold, as abovementioned, having 4 nm thickness by the evaporation method.

Next, the anode 662 is formed. In the present invention, since the light generated at the organic compound layer 660 radiates through the anode 602, the materials that is a transparent to the light is used to form the anode 662. Moreover, since the anode 662 injects hole to the organic compound layer 660, large work function material is needed. It should be noted that in the present embodiment, an indium oxide film, a tin (ITO) film, or a transparent electrically conductive film which mixed zinc oxide (ZnO) of 2 to 20% with indium oxide is performed sputtering for deposition to be in a film thickness of 100 nm is used as the anode 662. It should be also noted that if a transparent electrically conductive film has a large work function, the anode 662 may be formed by known other materials (IZO, IDIXO and the like). When the anode 662 is formed, heat damage given to the organic compound layer at the sputtering may be relieved by cooling a substrate from the reverse side of the substrate or maintaining that the substrate temperature is about 80° C.

As shown in FIG. 10B, the pixel electrode 657 connected to the current control TFT 704 electrically, the insulating layer 658 formed between the pixel electrode 657 and adjacent pixel electrode (not shown), the cathode 659 formed on the pixel electrode 657, the organic compound layer 660 formed on the cathode 659, the protection film 661 formed on the organic compound layer 660 and the insulating layer 658, and element substrate having a light emitting element 663 made from anode 662 formed on the protection film 661 may be formed.

In the manufacturing step of the light emitting device of the present embodiment, because of the circuit structure and the steps, the source wiring is formed by using a materials forming the gate electrode, and the scanning wiring is formed by using materials forming wirings connected with the source region and drain region. However, different materials can be used respectively.

Moreover, the light emitting device of the present invention can be implemented both in the case that the system that the predetermined voltage based on the video signal inputted from a source wiring is inputted into the gate of the current control TFT (hereinafter the system is referred to as a constant voltage driving system), or in the case that the system that the predetermined current based on the video signal inputted from a source signal line is inputted from the current control TFT 704 (hereinafter the system is referred to as a constant current driving system). In addition, in the present embodiment, the driving voltage of TFT is 1.2 to 10V, and is 2.5 to 5.5V preferably.

Further, the case that a part of the light emitting structure explained in FIG. 10B in the present embodiment is different is illustrated in FIG. 15.

In FIG. 15, the pixel electrode 1501 is formed same as FIG. 10B. The insulating film 1502 is formed to overlap the edge portion of the pixel electrode 1501. Here, the insulating film 1502 is formed by using inorganic insulating materials containing silicon such as silicon nitride, silicon oxide, and silicon oxynitride to have a thickness of 0.1 to 0.3 μm.

Specifically, the silicon nitride film is formed by sputtering to have a thickness of 0.2 μm.

As described above, forming the insulating layer 1502 by using inorganic insulating materials is effective to reduce water or organic gasses released from materials compared to using organic resin film.

Figure 15A:
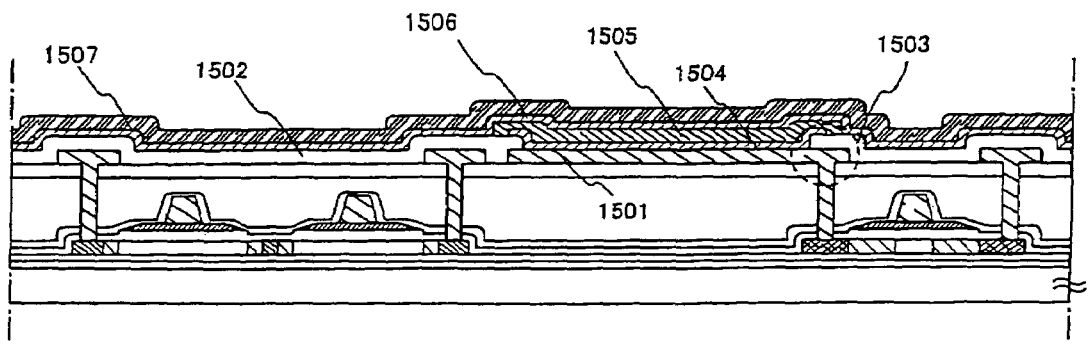
FIGS. 15A to 15D are diagrams for illustrating an element structure of a light emitting device of the present invention.
Figure 15B:
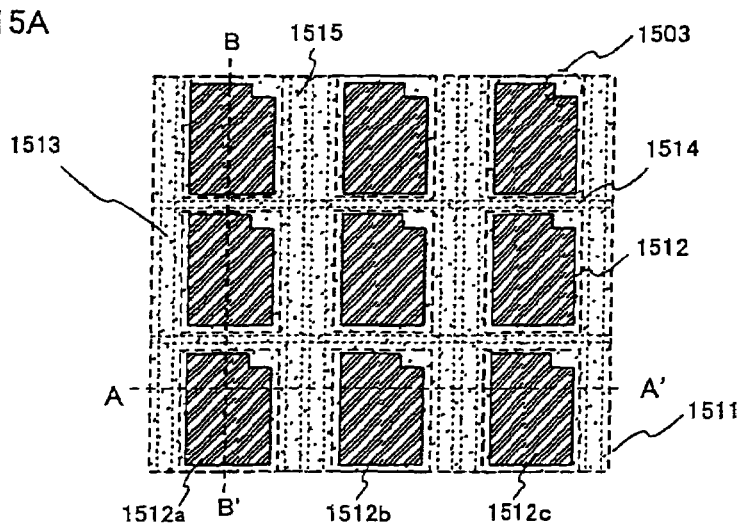

FIG. 15B shows a part of a top view of the pixel portion 1511 in the case of having a structure of FIG. 15A. In the pixel portion 1511, plural pixels 1512 are formed. The top view shown here is illustrated the state manufactured up through the insulating layer 1502 of FIG. 15A. Thus, the insulating film 1502 is formed to overlap the source wiring 1513, the scanning line 1514, and the current supply line 1515. The insulating layer 1502 also overlaps the region a 1503 in which a connecting portion of pixel electrode and TFT is formed at the bottom.

Figure 15C:
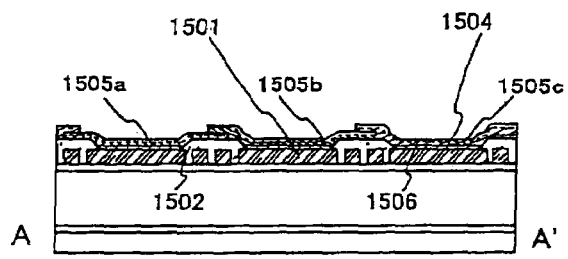

FIG. 15C is a cross-sectional view taken along the line of A-A' of the pixel portion 1511. And the state manufactured up through the cathode 1504, the organic compound layer 1505, the mixture region (not shown) and the protection film 1506 are formed on the pixel electrode 1501 is illustrated in FIG. 15C. The organic compound layer is formed consisting of the same material in the lengthwise direction to the surface, and the organic compound layer is formed consisting of different material in the lateral direction to the surface.

For example, the red light emitting organic compound layer (R) 1505a is formed in the pixel (R) 1512a in FIG. 15B, the green light emitting organic compound layer (G) 1505b is formed in the pixel (G) 1512b, the blue light emitting organic compound layer (B) 1505c is formed in the pixel (B) 1512c. The insulating layer 1502 is a margin of the organic compound layer. There is no problem if the organic compound layer formed from different materials is overlapped on the insulating layer 1502 by that the deposition area of the organic is off a little.

Figure 15D:
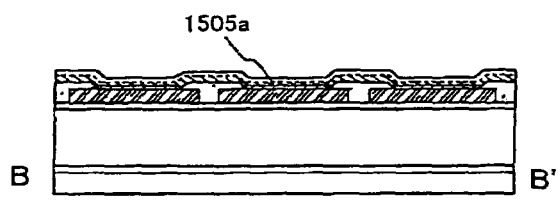

The FIG. 15D is a cross-sectional view taken along the line B-B' of pixel portion 1511 as shown in FIG. 15B. And the state manufactured up through the cathode 1504 and the organic compound layer 1505 on the pixel electrode 1501 same as FIG. 15C is illustrated in FIG. 15D.

The pixel taken along the line B-B' has a structure shown in FIG. 15D since the red light emitting organic compound layer (R) 1505a is formed same as the pixel (R) 1512a.

When the display of the pixel portion is active (case of the moving picture display), a background is displayed by pixels in which the light emitting elements emit light and a character is displayed by pixels in which the light emitting elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which light emitting elements emit light (also called a character display), and a background is displayed by pixels in which light emitting elements do not emit light (also called a background display).

Embodiment 4

In the present embodiment, a light emitting device in which one portion of the structure is different from that shown in Embodiment 3 will be described below with reference to FIG. 1.

Figure 11A:
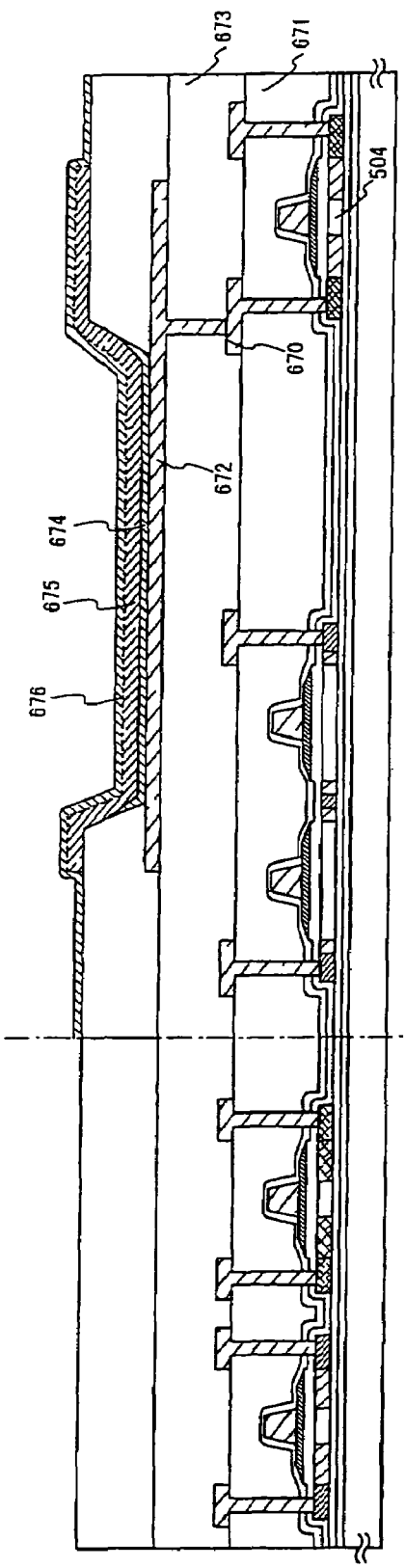
FIGS. 11A and 11B are diagrams for illustrating a manufacturing step of a light emitting device of the present invention.

In FIG. 11A, a wiring 670 is formed instead of the pixel electrode formed in FIG. 9C. Subsequently, a third interlayer insulating film 671 covering the wiring 670 is formed It should be noted that as a material used for the third interlayer insulating film 671 formed here, it can be formed using a material used at the time when the first and second interlayer insulating film are formed.

Next, after the opening has been formed at the position superimposed on the wiring 670 of the third interlayer insulating film 671, a pixel electrode 672 is formed. It should be noted that as a material for forming the pixel electrode 672, it could be formed using a material used for the formation of the wiring 670.

Furthermore, an insulation layer 673 is formed so as to cover the edge portions of the pixel electrode 672, and a cathode 674 and an organic compound layer 675 are formed on the pixel electrode 672. It should be noted that as for a material for forming the insulation layer 673, the insulation layer is formed in a film thickness of 1 μm using a photosensitive polyimide similar to that in Embodiment 3.

Figure 11B:
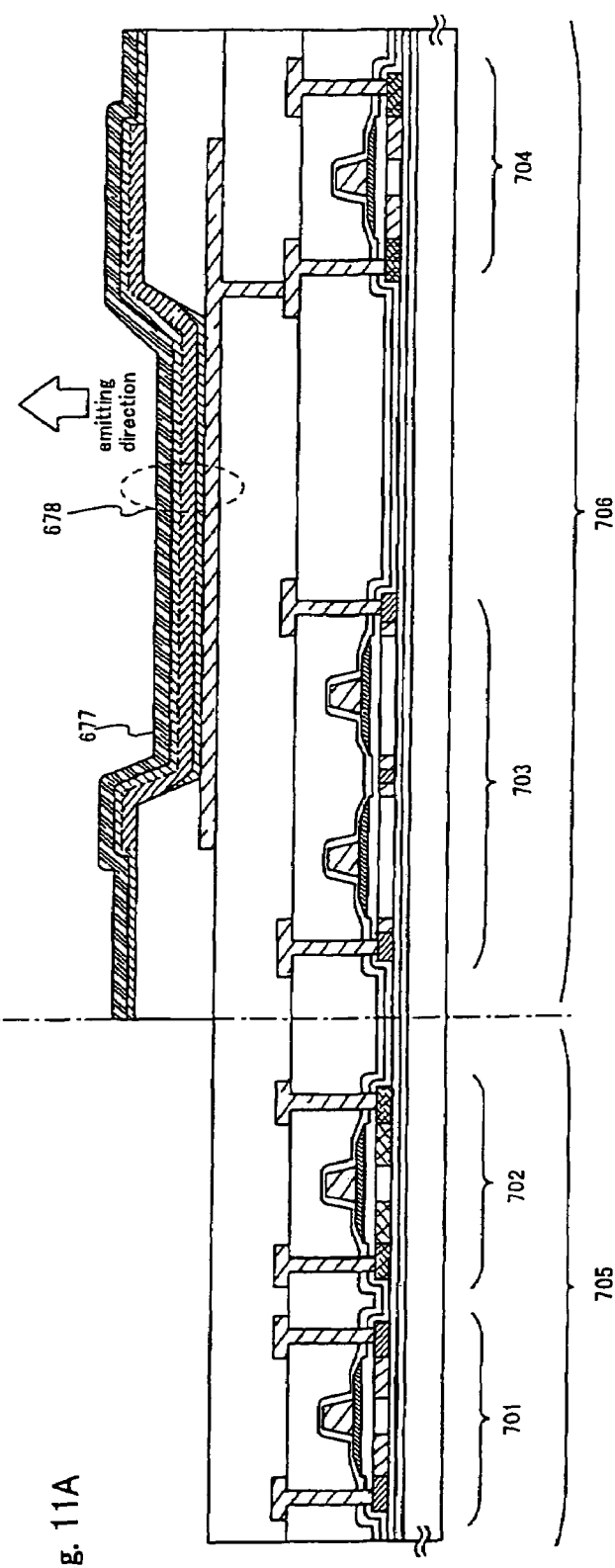

From the description described above, the protection film 676 and the anode 677 are formed on the organic compound layer 675 and the light emitting element 678 is completed as shown in FIG. 11B. It should be noted that after the pixel electrode 672 has been formed, since as for the preparation step it can be formed by the method similar to that of Embodiment 3, it is omitted.

It should be noted that since the area of the pixel electrode can be increased by making the structure as similar to that shown in the present embodiment, in an upper surface injection type light emitting device like the present invention, the opening ratio can be more enhanced.

Figure 16:
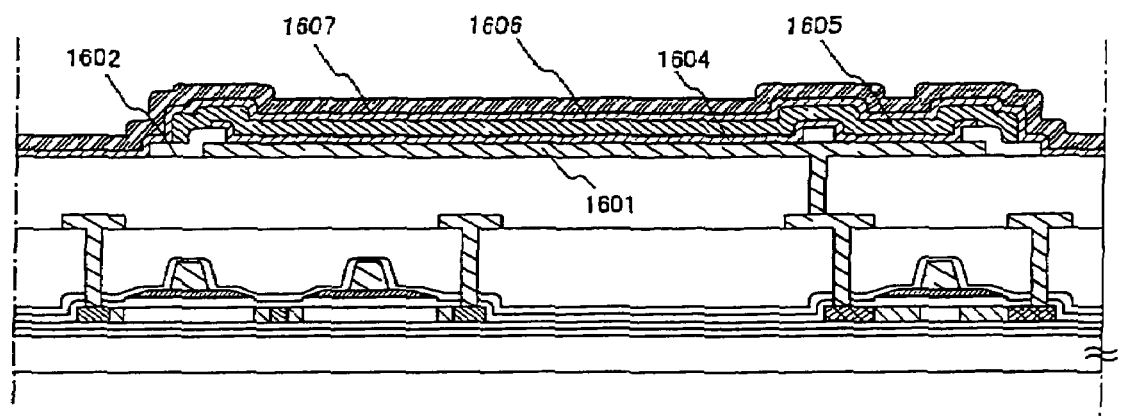
FIG. 16 is a diagram for illustrating an element structure of a light emitting device of the present invention.

Furthermore, the case, where one portion of the structure of the light emitting device described in FIG. 11B of the present embodiment is different, is shown in FIG. 16.

In FIG. 16, a pixel electrode 1601 is formed similar to that of FIG. 11B. Then, an inorganic insulating film 1602 is formed so as to cover the edge portions, but here, it is formed in a film thickness of 0.1 to 0.3 μm using an organic insulation material containing silicon such as silicon nitride, silicon oxide or silicon oxynitride or the like.

Concretely, a silicon nitride film is formed in a film thickness of 0.2 μm by a sputtering method.

As described above, water, an organic gas or the like discharged from the material can be reduced by forming the inorganic insulating film 1602 using an inorganic insulation material, compared to the case which is formed using an organic resin film. It should be noted that the cathod 1604, the organic compound layer 1605, the protection film 1606 and the anode 1607 which are formed after forming the insulating layer 1602 can be formed by the method similar to that of FIG. 11B.

Embodiment 5

In the present embodiment, a pixel configuration of the pixel portion of a light emitting device driven by a constant current drive method will be described below. A pixel 1310 shown in FIG. 13 has a signal line Si (one of S1 to Sx), a first scanning line Gj (one of G1 to Gy), a second scanning line Pj (one of P1 to Py) and an electric source Vi (one of V1 to Vx). Moreover, the pixel 1310 has a Tr1, a Tr2, a Tr3, a Tr4, a light emitting element 1311 and a storage capacitor 1312.

Both of the gates of the Tr3 and the Tr4 are connected to the first scanning line Gj. As for the source and the drain of the Tr3, one of them is connected to the signal line Si, and the other is connected to the source of the Tr2. Moreover, as for the source and the drain of the Tr4, one of them is connected to the source of the Tr2, and the other is connected to the gate of the Tr1. Specifically, either of the source or the drain of the Tr3 and either of the source or the drain of the Tr4 are connected.

The source of the Tr1 is connected to the electric source line Vi, and the drain is connected to the source of the Tr2. The gate of the Tr2 is connected to the second scanning line Pj. Then, the drain of the Tr2 is connected to the light emitting element 1311 formed on the pixel electrode via the pixel electrode. The light emitting element 1311 has a cathode, an anode, an organic compound layer provided between the cathode and the anode. The anode of the light emitting element 1311 is given a certain voltage by an electric source provided outside.

It should be noted that the Tr3 and the Tr4 might be either of n-channel type TFT or p-channel type TFT. However, the polarity of the Tr3 and the Tr4 is the same polarity with each other. Moreover, the Tr1 may be either of n-channel type TFT or p-channel type TFT. The Tr2 may be n-channel type TFT or p-channel type TFT, but since in the present invention the electrode connected to the Tr2 is a cathode, it is preferable to form Tr2 with n-channel type TFT.

The storage capacitor 1312 has been formed between the gate and source of the Tr1. The storage capacitor 1312 has been provided for the purpose of more securely maintaining the voltage ($V_{GS}$) between the gate and source of the Tr1, but it is not necessarily to be provided.

Figure 13:
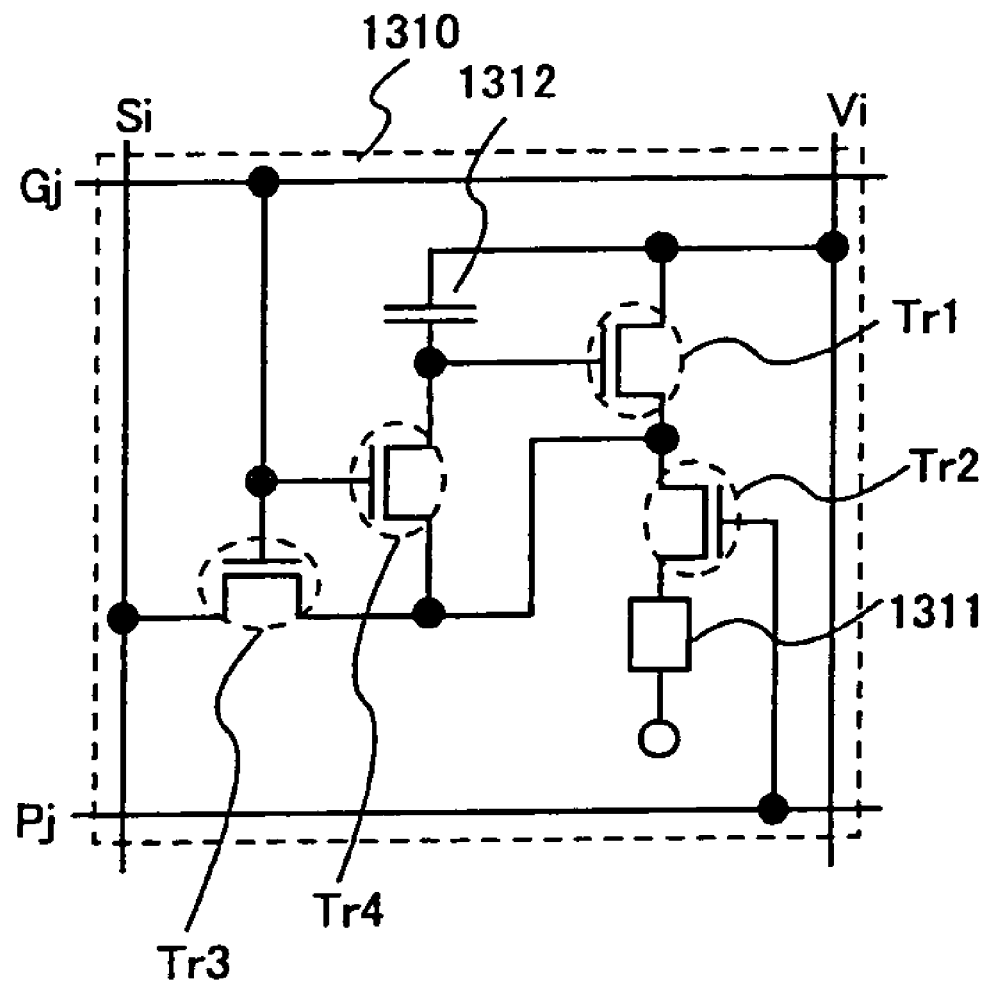
FIG. 13 is a diagram for illustrating a circuit configuration applicable to a light emitting device of the present invention.

In the pixel shown in FIG. 13, the current supplied to the source line is controlled by the current source included the signal line drive circuit.

It should be noted that a configuration of the present invention could be carried out by freely combining it with any configuration of Embodiment 1 to Embodiment 4.

Embodiment 6

Referring to FIG. 12, the external appearance of a light emitting device of the present invention will be described in Embodiment 6. FIG. 12A is a top view of the light emitting device, and FIG. 12B is a sectional view taken on line A-A' of FIG. 12A. Reference number 1201 represents a source side driver circuit, which is shown by a dotted line; 1202, a pixel portion; 1203, a gate side driving circuit; 1204, a sealing substrate; and 1205, a sealant. Inside surrounded by the sealant 1205 is a space.

Reference number 1208 represents for transmitting signals inputted to the source side driver circuit 1201 and the gate side driver circuit 1203. The connecting wiring 1208 receives video signals or clock signals from a flexible print circuit (FPC) 1209, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 12B. The driver circuits and the pixel portion are formed on the substrate 1210, but the source signal line driver circuit 1201 as one of the driver circuits and the pixel portion 1202 are shown in FIG. 12B.

In the source side driver circuit 1201, a CMOS circuit wherein an n-channel type TFT 1213 and a p-channel type TFT 1214 are combined is formed. The TFTs constituting the driver circuit may comprise known CMOS circuits, PMOS circuits or NMOS circuits. In Embodiment 6, a driver-integrated type, wherein the driver circuit is formed on the substrate, is illustrated, but the driver-integrated type may not necessarily be adopted. The driver may be fitted not to the substrate but to the outside.

The pixel portion 1202 comprises plural pixels including a current control TFT 1211 and a pixel electrode 1212 electrically connected to the drain of the TFT 1211.

On the both sides of the pixel electrode 1212, insulating layer 1213 is formed, and the cathode 1214 is formed on the pixel electrode 1212, and the organic compound layer 1215 is formed on the cathode 1214. Furthermore, the compound layer (not shown) is formed at the interface of the organic compound layer 1215 and the protection film 1216, and the anode 1217 is formed on the protection film 1216. Thus, a light emitting element 1218 comprising the cathode 1214, the organic compound layer 1215, the protection film 1216 and the anode 1217 is formed.

The anode 1217 also functions as a wiring common to all of the pixels. And the anode 1217 is electrically connected through the interconnection line 1208 to the FPC 1209.

In order to confine the light emitting element 1218 formed on the substrate 1210 airtightly, the sealing substrate 1204 is adhered to the substrate 1210 with the sealant 1205. A spacer made of a resin film may be set up to keep a given interval between the cover material 1204 and the light emitting element 1219. An inert gas such as nitrogen is filled into the space 1207 inside the sealant 1205. As the sealant 1205, an epoxy resin is preferably used. The sealant 1205 is desirably made of a material through which water content or oxygen is transmitted as slightly as possible. Furthermore, it is allowable to incorporate a material having moisture absorption effect or a material having anti-oxidation effect into the space 1207.

In Embodiment 6, as the material making the sealing substrate 1204, there may be used a glass substrate, a quartz substrate, or a plastic substrate made of FRP (Fiber glass-Reinforced Plastic), PVF (polyvinyl fluoride), mylar, polyester or polyacrylic resin. After the adhesion of the sealing substrate 1204 to the substrate 1210 with the sealant 1205, a sealant is applied so as to cover the side faces (exposure faces).

As described above, the light emitting element is airtightly put into the space 1207, so that the light emitting element can be completely shut out from the outside and materials promoting deterioration of the organic compound layer, such as water content and oxygen, can be prevented from invading this layer from the outside. Consequently, the light emitting device can be made highly reliable.

The structure of the present embodiment may be freely combineed with the structure of Embodiments 1 to 5.

Embodiment 7

Being self-luminous, a light emitting device using a light emitting element has better visibility in bright places and wider viewing angle than liquid crystal display devices. Therefore, various electric appliances can be completed by using the light emitting device of the present invention.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 14A to 14H.

Figure 14A:
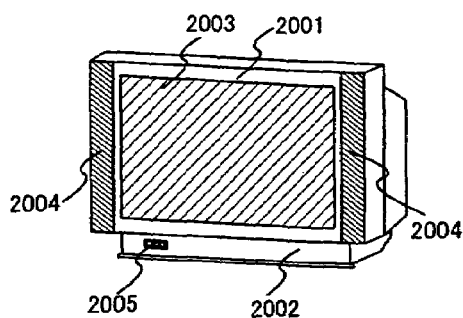
FIGS. 14A to 14H are drawings for showing one example of electronic appliances.

FIG. 14A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 14B:
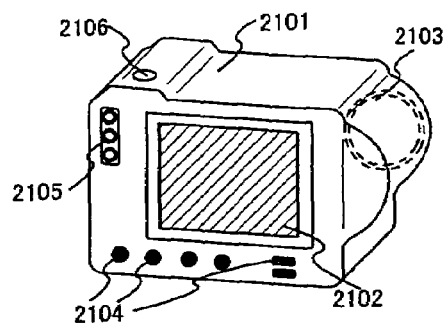

FIG. 14B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 14C:
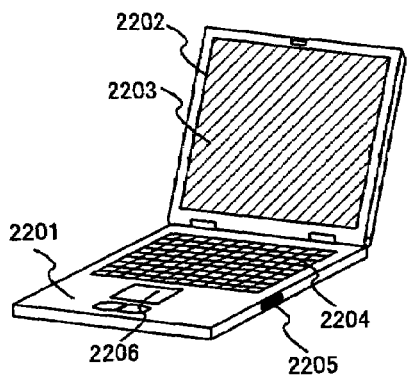

FIG. 14C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 14D:
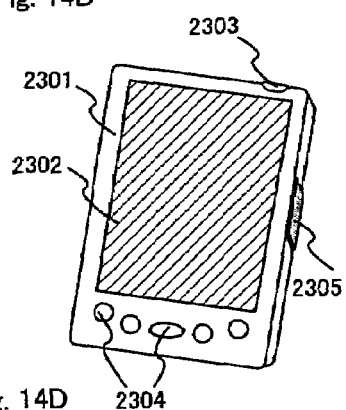

FIG. 14D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 14E:
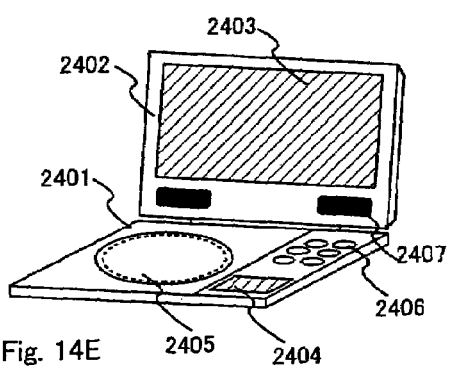

FIG. 14E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 14F:
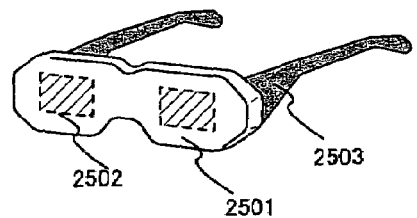

FIG. 14F shows a goggle type display (head mounted display), which is composed of a main body 2501, display units 2502, and arm units 2503. The light emitting device manufactured in accordance with the present invention can be applied to the display units 2502.

Figure 14G:
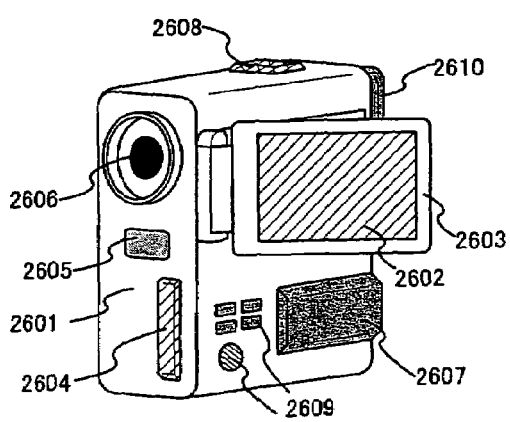

FIG. 14G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

Figure 14H:
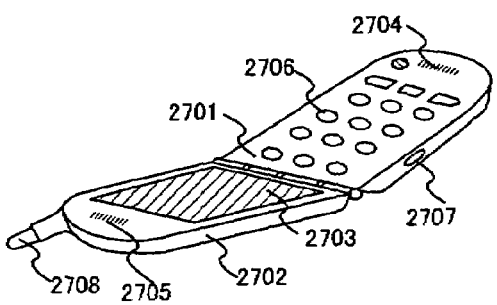

FIG. 14H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of the present embodiment can be completed by using the light emitting device formed by implementing Embodiments 1 to 6.

Embodiment 8

Figure 19:
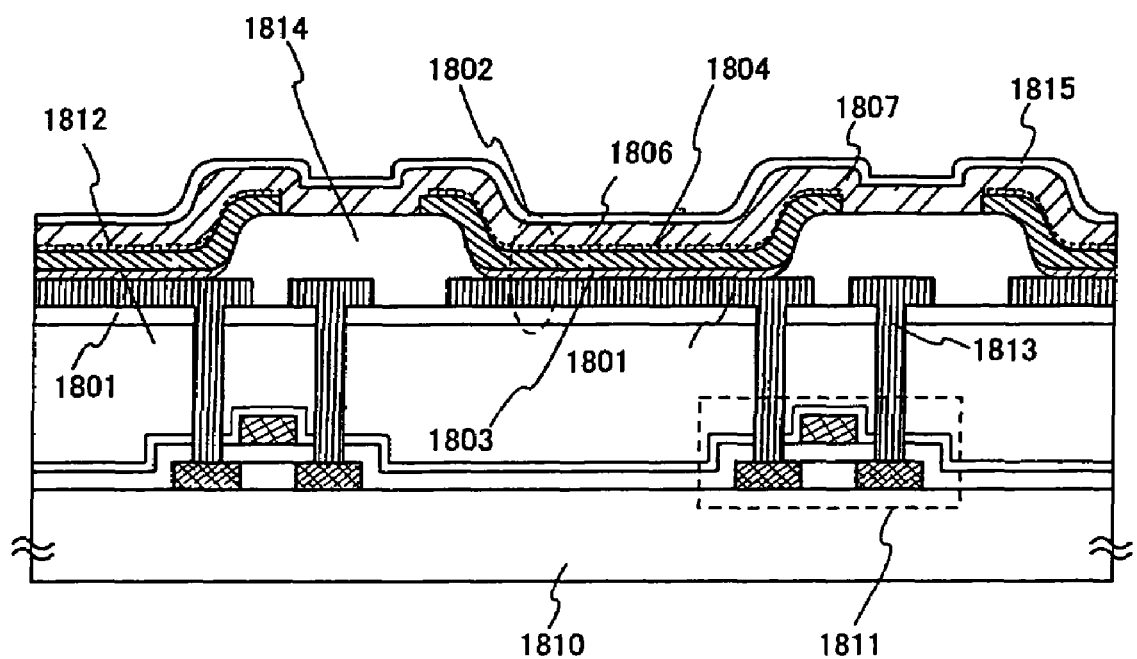
FIG. 19 is a diagrams for illustrating an element structure of a light emitting device of the present invention.

Furthermore, the light emitting device of the present invention can be formed into a structure shown in FIG. 19.

As an insulating layer 1814 (it is called a bank, a dividing wall, a barrier and an embankment) that covers an end portion (and wiring 1813) of a cathode 1803, an inorganic material (silicon oxide, silicon nitride, and silicon oxide nitride), a photosensitive or non-photosensitive organic material (polyimide, acryl, polyamide, polyimide-amide, resist or benzocyclobutene), or a laminate thereof can be used. For instance, when positive type photosensitive acryl is used as an organic resin material, as shown in FIG. 19, an end portion of an insulator is preferably formed so as to have a curvature radius in the range of 0.2 to 2 μm and to have a curved surface whose angle in a contact surface is 35 degree or more.

Furthermore, as a material that is used for an organic compound layer 1804 of a light emitting 1802, a white-emitting material can be used. In this case, by use of a vapor deposition method, for instance, from the cathode 1803 side, TPD (aromatic diamine), p-EtTAZ, $Alq_3$, $Alq_3$ that is partially doped with Nile Red that is a red-emitting dye, and $Alq_3$ need only be sequentially deposited.

Furthermore, on an anode 1807 of the light emitting 1802 an insulating material may be formed into a passivation film 1815. At this time, as a material being used for the passivation film 1815, in the sputtering method, other than a silicon nitride film formed with a silicon target, a laminate film that is formed of silicon nitride films with a hygroscopic material interposed between the silicon nitride films can be used. Furthermore, a DLC film (diamond-like carbon film) and carbon nitride (CxNy) can be used.

In the present invention by forming a top emission type light emitting device, an element having a higher opening ratio can be formed compared to that of a bottom emission type light emitting device. Moreover, in steps of manufacturing of the top emission type light emitting device, the electrode (bottom electrode) connected to a TFT functioning as the cathode and the electrode to extract the light (top electrode) formed on the organic compound layer functioning as the anode are formed on the cathode, thus a light emitting element having a different element structure from the conventional top emission type light emitting device can be formed by utilizing as the anode material a transparent conductive film of ITO, IZO or the like having a property that can be used in the practical application as a material.

Owing to this, the present invention can solve the contradiction occurred to satisfy both the two things; requiring of a sufficient film formation to maintain the function as a cathode and forming in an extremely thin film in order to secure the translucency as the light extraction electrode in the case of an element structure in which the light is extracted from the cathode side the top electrode.

Furthermore, the damage to the organic compound layer which is a problem of the anode formation can be prevented by providing a protection film at the interface between the organic compound layer and the anode.

What is claimed is:

1. A method for manufacturing a light emitting device comprising:

forming a thin film transistor over an insulating surface;

forming an interlayer insulating film comprising an organic resin, over the thin film transistor;

forming an insulating film comprising aluminum nitride, aluminum nitrided oxide, aluminum oxynitride, silicon nitride or silicon oxynitride on the interlayer insulating film;

forming a conductive film on the insulating film;

etching the conductive film to form a pixel electrode and a wiring, wherein the pixel electrode is electrically connected to one of a source region and a drain region of the thin film transistor, and the wiring is electrically connected to the other of the source region and the drain region of the thin film transistor;

forming an insulating film covering at least one edge portion of the pixel electrode;
forming a first electrode on at least the pixel electrode;
forming an electron transporting layer including a first organic compound over at least the first electrode;
forming a first mixture layer including the first organic compound and a second organic compound on the electron transporting layer;
forming a blocking layer including the second organic compound on the first mixture layer;
forming a second mixture layer including the second organic compound, a third organic compound and a complex including iridium on the blocking layer;
forming a light emitting layer including the third organic compound and the complex on the second mixture layer;
forming a third mixture layer including the third organic compound, the complex and a fourth organic compound on the light emitting layer;
forming a hole transporting layer including the fourth organic compound on the third mixture layer;
forming a fourth mixture layer including the fourth organic compound and a fifth organic compound on the hole transporting layer;
forming a hole injection layer including the fifth organic compound on the fourth mixture layer;
after forming the hole injection layer, forming a mixture region by depositing the fifth organic compound and a metal simultaneously;
after forming the mixture region, forming a protection film by depositing the metal; and
forming a second electrode on at least the protection film by sputtering.

2. A method for manufacturing a light emitting device according to claim 1, wherein the protection film has a work function in the range of 4.5 to 5.5 eV.

3. A method for manufacturing a light emitting device according to claim 1, wherein the metal is a metal belonging to the 9th, 10th, or 11th group in a periodic table.

4. A method for manufacturing a light emitting device according to claim 1, wherein the metal is gold, silver, or platinum.

5. A method for manufacturing a light emitting device according to claim 1, wherein a content of the metal in an entirety of the mixture region is in the range of 10 to 50%.

6. A method for manufacturing a light emitting device according to claim 1, wherein each of the protection film and the second electrode has transmittance in the range of 70 to 100%.

7. A method for manufacturing a light emitting device according to claim 1, wherein the light emitting device is selected from a group consisting of a digital camera, a personal computer, a mobile computer, a portable image reproducing device, a goggle type display, a video camera, and a cellular phone.

8. A method for manufacturing a light emitting device comprising:
forming a thin film transistor over an insulating surface;
forming an interlayer insulating film comprising an organic resin, over the thin film transistor;
forming an insulating film comprising aluminum nitride, aluminum nitrided oxide, aluminum oxynitride, silicon nitride or silicon oxynitride on the interlayer insulating film;
forming a conductive film on the insulating film;
etching the conductive film to form a pixel electrode and a wiring, wherein the pixel electrode is electrically connected to one of a source region and a drain region of the thin film transistor, and the wiring is electrically connected to the other of the source region and the drain region of the thin film transistor;
forming an insulating film covering at least one edge portion of the pixel electrode;
forming a first electrode on at least the pixel electrode;
forming an electron transporting layer including a first organic compound over at least the first electrode;
forming a first mixture layer including the first organic compound and a second organic compound on the electron transporting layer;
forming a blocking layer including the second organic compound on the first mixture layer;
forming a second mixture layer including the second organic compound, a third organic compound and a complex including iridium on the blocking layer;
forming a light emitting layer including the third organic compound and the complex on the second mixture layer;
forming a third mixture layer including the third organic compound, the complex and a fourth organic compound on the light emitting layer;
forming a hole transporting layer including the fourth organic compound on the third mixture layer;
forming a fourth mixture layer including the fourth organic compound and a fifth organic compound on the hole transporting layer;
forming a hole injection layer including the fifth organic compound on the fourth mixture layer;
after forming the hole injection layer, forming a mixture region by coating a solution including the fifth organic compound and a metal;
after forming the mixture region, forming a protection film including the metal; and
forming a second electrode on at least the protection film by sputtering.

9. A method for manufacturing a light emitting device according to claim 8, wherein the protection film has a work function in the range of 4.5 to 5.5 eV.

10. A method for manufacturing a light emitting device according to claim 8, wherein the metal is a metal belonging to the 9th, 10th, or 11th group in a periodic table.

11. A method for manufacturing a light emitting device according to claim 8, wherein the metal is gold, silver, or platinum.

12. A method for manufacturing a light emitting device according to claim 8, wherein a content of the metal in an entirety of the mixture region is in the range of 10 to 50%.

13. A method for manufacturing a light emitting device according to claim 8, wherein each of the protection film and the second electrode has transmittance in the range of 70 to 100%.

14. A method for manufacturing a light emitting device according to claim 8, wherein the light emitting device is selected from a group consisting of a digital camera, a personal computer, a mobile computer, a portable image reproducing device, a goggle type display, a video camera, and a cellular phone.

15. A method for manufacturing a light emitting device comprising:
forming a thin film transistor over an insulating surface;
forming an interlayer insulating film comprising an organic resin, over the thin film transistor;
forming an insulating film comprising aluminum nitride, aluminum nitrided oxide, aluminum oxynitride, silicon nitride or silicon oxynitride on the interlayer insulating film;
forming a conductive film on the insulating film;

etching the conductive film to form a pixel electrode and a wiring, wherein the pixel electrode is electrically connected to one of a source region and a drain region of the thin film transistor, and the wiring is electrically connected to the other of the source region and the drain region of the thin film transistor;

forming an insulating film covering at least one edge portion of the pixel electrode;

forming a first electrode on at least the pixel electrode;

forming an electron transporting layer including a first organic compound over at least the first electrode;

forming a blocking layer including a second organic compound on the electron transporting layer;

forming a first mixture layer Including the second organic compound, a third organic compound and a complex including iridium on the blocking layer;

forming a light emitting layer including the third organic compound and the complex on the first mixture layer;

forming a second mixture layer including the third organic compound, the complex and a fourth organic compound on the light emitting layer;

forming a hole transporting layer including the fourth organic compound on the second mixture layer;

forming a hole injection layer including a fifth organic compound on the hole transporting layer;

after forming the hole injection layer, forming a mixture region by depositing the fifth organic compound and a metal simultaneously;

after forming the mixture region, forming a protection film by depositing the metal; and forming a second electrode on at least the protection film by sputtering.

16. A method for manufacturing a light emitting device according to claim 15, wherein the protection film has a work function in the range of 4.5 to 5.5 eV.

17. A method for manufacturing a light emitting device according to claim 15, wherein the metal is a metal belonging to the 9th, 10th, or 11th group in a periodic table.

18. A method for manufacturing a light emitting device according to claim 15, wherein the metal is gold, silver, or platinum.

19. A method for manufacturing a light emitting device according to claim 15, wherein a content of the metal in an entirety of the mixture region is in the range of 10 to 50%.

20. A method for manufacturing a light emitting device according to claim 15, wherein each of the protection film and the second electrode has transmittance in the range of 70 to 100%.

21. A method for manufacturing a light emitting device according to claim 15, wherein the light emitting device is selected from a group consisting of a digital camera, a personal computer, a mobile computer, a portable image reproducing device, a goggle type display, a video camera, and a cellular phone.

22. A method for manufacturing a light emitting device comprising:

forming a thin film transistor over an insulating surface;

forming an interlayer insulating film comprising an organic resin, over the thin film transistor;

forming an insulating film comprising aluminum nitride, aluminum nitrided oxide, aluminum oxynitride, silicon nitride or silicon oxynitride on the interlayer insulating film;

forming a conductive film on the insulating film;

etching the conductive film to form a pixel electrode and a wiring, wherein the pixel electrode is electrically connected to one of a source region and a drain region of the thin film transistor, and the wiring is electrically connected to the other of the source region and the drain region of the thin film transistor;

forming an insulating film covering at least one edge portion of the pixel electrode;

forming a first electrode on at least the pixel electrode;

forming an electron transporting layer including a first organic compound over at least the first electrode;

forming a blocking layer including a second organic compound on the electron transporting layer;

forming a first mixture layer Including the second organic compound, a third organic compound and a complex including iridium on the blocking layer;

forming a light emitting layer including the third organic compound and the complex on the first mixture layer;

forming a second mixture layer including the third organic compound, the complex and a fourth organic compound on the light emitting layer;

forming a hole transporting layer including the fourth organic compound on the second mixture layer;

forming a hole injection layer including a fifth organic compound on the hole transporting layer;

after forming the hole injection layer, forming a mixture region by coating a solution including the fifth organic compound and a metal;

after forming the mixture region, forming a protection film including the metal; and forming a second electrode on at least the protection film by sputtering.

23. A method for manufacturing a light emitting device according to claim 22, wherein the protection film has a work function in the range of 4.5 to 5.5 eV.

24. A method for manufacturing a light emitting device according to claim 22, wherein the metal is a metal belonging to the 9th, 10th, or 11th group in a periodic table.

25. A method for manufacturing a light emitting device according to claim 22, wherein the metal is gold, silver, or platinum.

26. A method for manufacturing a light emitting device according to claim 22, wherein a content of the metal in an entirety of the mixture region is in the range of 10 to 50%.

27. A method for manufacturing a light emitting device according to claim 22, wherein each of the protection film and the second electrode has transmittance in the range of 70 to 100%.

28. A method for manufacturing a light emitting device according to claim 22, wherein the light emitting device is selected from a group consisting of a digital camera, a personal computer, a mobile computer, a portable image reproducing device, a goggle type display, a video camera, and a cellular phone.

* * * * *